US009236673B2

(12) United States Patent
Jeon et al.

(10) Patent No.: US 9,236,673 B2
(45) Date of Patent: Jan. 12, 2016

(54) MEZZANINE HEADER CONNECTOR

(71) Applicant: Tyco Electronics Corporation, Berwyn, PA (US)

(72) Inventors: James Myoungsoo Jeon, Harrisburg, PA (US); Chad W. Morgan, Carneys Point, NJ (US); Andy M. Homick, Camp Hill, PA (US); Paul Hollis, Harrisburg, PA (US)

(73) Assignee: Tyco Electronics Corporation, Berwyn, PA (US)

(*) Notice: Subject to any disclaimer, the term of this patent is extended or adjusted under 35 U.S.C. 154(b) by 50 days.

(21) Appl. No.: 14/283,477

(22) Filed: May 21, 2014

(65) Prior Publication Data

US 2015/0303601 A1 Oct. 22, 2015

(51) Int. Cl.

| | |
|---|---|
| ***H05K 1/14*** | (2006.01) |
| ***H01R 12/71*** | (2011.01) |
| ***H01R 13/42*** | (2006.01) |
| ***H01R 13/6581*** | (2011.01) |

(52) U.S. Cl.

CPC .............. *H01R 12/716* (2013.01); *H01R 13/42* (2013.01); *H01R 13/6581* (2013.01)

(58) Field of Classification Search

CPC ... H01R 12/716; H01R 13/42; H01R 13/6581
USPC .......... 439/65, 66, 74, 75, 108, 607.5, 607.11
See application file for complete search history.

(56) References Cited

U.S. PATENT DOCUMENTS 7,597,581 B2 * 10/2009 Trout .................. H01R 13/633 439/474
7,837,479 B1 11/2010 Millard et al.
7,967,638 B1 * 6/2011 Kline ................. H01R 12/7082 439/607.07
7,985,079 B1 * 7/2011 Wilson .................. H01R 12/52 439/74
8,157,591 B2 * 4/2012 Fedder .................. H01R 13/54 439/108
2009/0117781 A1 5/2009 Johnescu et al.

(Continued)

FOREIGN PATENT DOCUMENTS

EP 2194606 A1 6/2010
WO 03/094304 A1 11/2003

(Continued)

OTHER PUBLICATIONS

International Search Report dated Jun. 26, 2015 for International Application No. PCT/US2015/026276.

*Primary Examiner* — Abdullah Riyami
*Assistant Examiner* — Nelson R Burgos-Guntin

(57) ABSTRACT

A mezzanine header connector includes header modules stacked side-by-side having housing frames holding contact assemblies. Each contact assembly includes header contacts held by at least one dielectric holder. The header contacts have mating segments for termination to corresponding receptacle contacts of a mezzanine receptacle connector and terminating segments for termination to a circuit board. Each of the header contacts extend along a linear path between the corresponding mating segment and the corresponding terminating segment. Each housing frame has walls defining pockets receiving corresponding header contacts of the contact assembly. The housing frame is conductive and provides shielding around the associated header contacts of the contact assemblies. The header contacts face associated walls with air separating the header contacts and the walls along a majority of the header contacts.

20 Claims, 14 Drawing Sheets

(56) References Cited

U.S. PATENT DOCUMENTS

2010/0184307 A1* 7/2010 Arai ........................ H04M 1/76 439/65
2012/0178273 A1* 7/2012 Cipolla .............. H01R 13/6587 439/65
2013/0288525 A1 10/2013 McClellan et al.

FOREIGN PATENT DOCUMENTS

WO WO 03094304 A1 * 11/2003 ........... H01R 13/514
WO 2007076900 A1 7/2007

* cited by examiner

MEZZANINE HEADER CONNECTOR

BACKGROUND OF THE INVENTION

The subject matter herein relates generally to mezzanine header connectors.

Known mezzanine connectors mechanically and electrically interconnect a pair of circuit boards in a parallel arrangement. Typically, the mezzanine connector will engage both circuit boards to interconnect the circuit boards. For example, the mezzanine connector will be mounted to one of the circuit boards and will engage the other circuit board at a separable mating interface. The mezzanine connector typically uses deflectable spring beams at the separable mating interface. However, such interfaces require a significant amount of real estate and space because the spring beams require long beam lengths to achieve the required spring force and deformation range. Contact density of such mezzanine connectors is limited because of the separable mating interface. At least some known mezzanine connector systems utilize two mezzanine connectors, each mounted to a different circuit board and then mated together. Such systems can be complex and difficult to manufacture. For example, such mezzanine connectors have many contacts individually loaded into a housing, which may be difficult and time consuming to assemble. Furthermore, known mezzanine connectors suffer from signal performance limits due to the tight spacing of the contacts in the mezzanine connectors.

Thus, a need exists for a mezzanine connector assembly that provides a cost effective and reliable connection between circuit boards.

BRIEF DESCRIPTION OF THE INVENTION

In one embodiment, a mezzanine header connector is provided including a plurality of header modules stacked side-by-side. The plurality of header modules include a plurality of contact assemblies and a plurality of housing frames holding corresponding contact assemblies. Each contact assembly includes a plurality of header contacts held by at least one dielectric holder. The header contacts have mating segments being exposed at a mating end of the dielectric holder for termination to corresponding receptacle contacts of a mezzanine receptacle connector. The header contacts have terminating segments extending from a mounting end of the dielectric holder for termination to a circuit board. Each of the header contacts extend along a linear path between the corresponding mating segment and the corresponding terminating segment. Each housing frame has walls defining pockets receiving corresponding header contacts of the contact assembly. The housing frame is conductive and provides shielding around the associated header contacts of the contact assemblies. The header contacts face associated walls with air separating the header contacts and the walls along a majority of the header contacts.

In another embodiment, a mezzanine header connector is provided including a plurality of header modules stacked side-by-side in a header module stack. The plurality of header modules include a plurality of contact assemblies and a plurality of housing frames holding corresponding contact assemblies. Each contact assembly includes a plurality of header contacts held by at least one dielectric holder. The header contacts have mating segments being exposed at a mating end of the dielectric holder for termination to corresponding receptacle contacts of a mezzanine receptacle connector and terminating segments extending from the mounting end of the dielectric holder for termination to a circuit board. Each of the header contacts extend along a linear path between the corresponding mating segment and the corresponding terminating segment. Each housing frame has walls defining pockets receiving corresponding header contacts of the contact assembly. The housing frame is conductive and provides shielding around the associated header contacts of the contact assemblies. A ground lattice is provided at an end of the header module stack. The ground lattice includes header ground shields discrete from the housing frames of the header modules. The header ground shields are mechanically and electrically coupled to associated housing frames. The header ground shields provide electrical shielding for the header contacts.

In a further embodiment, a mezzanine header connector is provided that includes a plurality of header modules stacked side-by-side each having a contact assembly and a housing frame holding the corresponding contact assembly. The contact assembly includes a pair of contact modules arranged back-to-back each having a dielectric holder holding a plurality of header contacts. The header contacts are arranged on opposite sides of the contact assembly to form differential pairs of header contacts. The dielectric holder extends between a mating end and a mounting end opposite the mating end. The dielectric holder has an inner side and an outer side. The header contacts have mating segments being exposed along the outer side at the mating end for termination to corresponding receptacle contacts of a mezzanine receptacle connector and terminating segments extending from the mounting end of the dielectric holder for termination to a circuit board. Each of the header contacts extend along a linear path between the corresponding mating segment and the corresponding terminating segment. The inner sides of the dielectric holders of the pair of contact modules abut against each other such that the header contacts face away from each other. The housing frame has a first side and a second side with a first chamber at the first side and a second chamber at the second side. The contact assemblies are positioned between housing frames of adjacent header modules such that a portion of each contact assembly is received in the first chamber of one housing frame and another portion of each contact assembly is received in the second chamber of the adjacent housing frame. The housing frames are conductive and provide shielding around the pairs of header contacts.

DETAILED DESCRIPTION OF THE INVENTION

Figure 1:
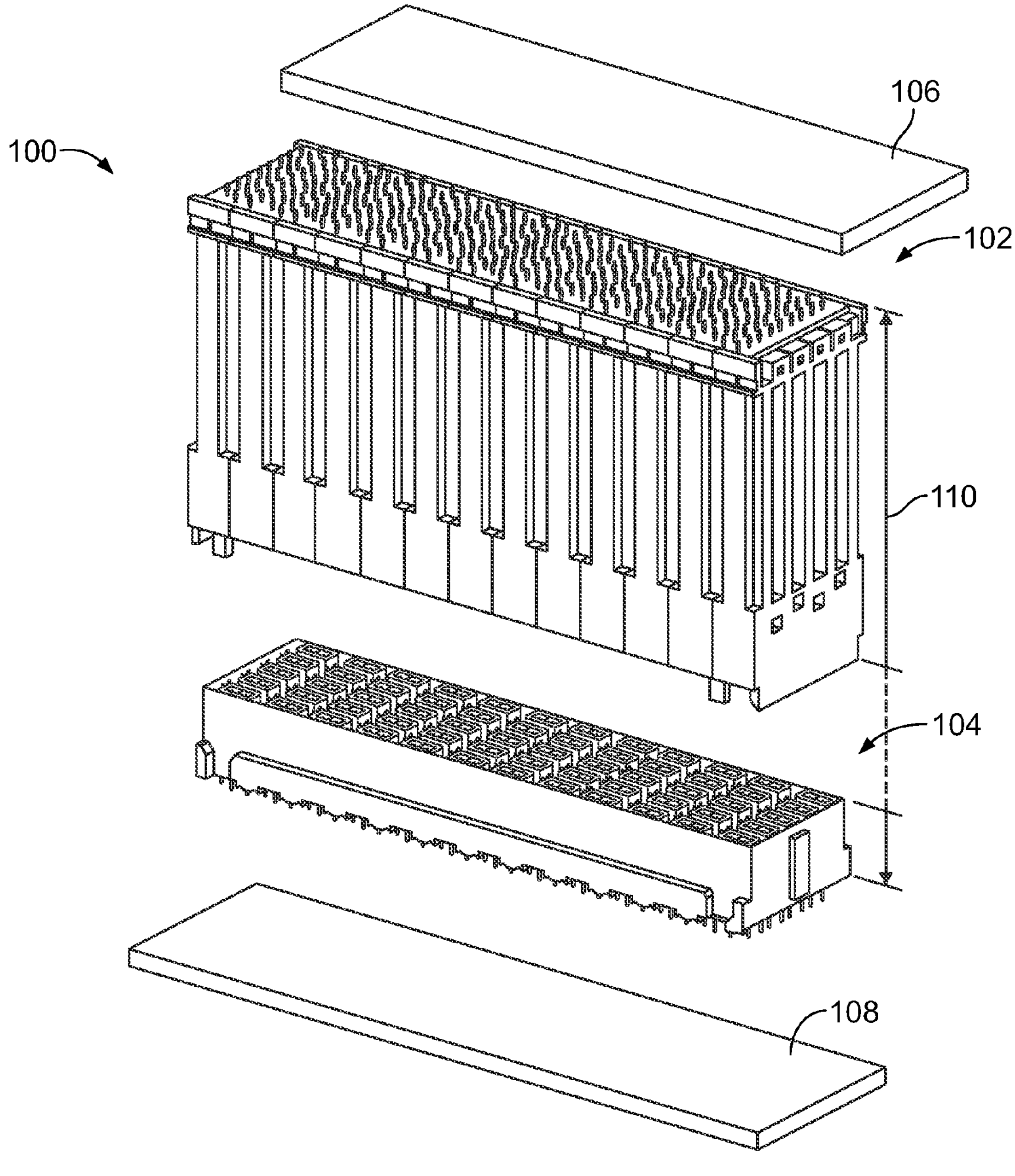
FIG. 1 illustrates a mezzanine connector assembly formed in accordance with an exemplary embodiment.

FIG. 1 illustrates a mezzanine connector assembly 100 formed in accordance with an exemplary embodiment. The mezzanine connector assembly 100 includes a mezzanine header connector 102 and a mezzanine receptacle connector 104 that are mated together to electrically connect first and second circuit boards 106, 108. The mezzanine header connector 102 and mezzanine receptacle connector 104 are arranged to interconnect the first and second circuit boards 106, 108 in a parallel arrangement. However, it is realized that the subject matter herein may be used in other types of electrical connectors as well, such as right angle connectors, cable connectors (being terminated to an end of one or more cables), or other types of electrical connectors.

The circuit boards 106, 108 are interconnected by the header and receptacle connectors 102, 104 so that the circuit boards 106, 108 are substantially parallel to one another. The first and second circuit boards 106, 108 include conductors that communicate data signals and/or electric power between the header and receptacle connectors 102, 104 and one or more electric components (not shown) that are electrically connected to the circuit boards 106, 108. The conductors may be embodied in electric pads or traces deposited on one or more layers of the circuit boards 106, 108, in plated vias, or in other conductive pathways, contacts, and the like.

The mezzanine header and receptacle connectors 102, 104 separate the first and second circuit boards 106, 108 by a stack height 110, which is the combined height of the header and receptacle connectors 102, 104 when mated. In an exemplary embodiment, the mezzanine header connector 102 is scalable to adjust or change the stack height 110. For example, the stack height 110 may be varied by utilizing different mezzanine header connectors 102 having different heights. Differently sized header connectors 102 may be provided, defining a family of mezzanine header connectors 102. The different members of the family have different heights so the appropriate or desired stack height 110 may be achieved. The interfaces of the mezzanine header connectors 102 with the mezzanine receptacle connector 104 may be identical for all members of the family. Similarly, the interfaces of the mezzanine header connectors 102 with the first circuit board 106 may be identical for all members of the family such that only the mezzanine header connector 102 needs to be replaced to change the stack height 110, while the mezzanine receptacle connector 104 and circuit boards 106, 108 may be the same.

In an exemplary embodiment, the mezzanine header connector 102 is modular in design, having any number of modules or units stacked together to vary the number of conductors within the mezzanine header connector 102. The various modules or units may have different characteristics. For example, the modules or units may communicate data signals, may communicate electric power, or may communicate both data and power. Different modules or units may have different features that change the impedance of the signal conductors within such module or unit. For example, some or all of the modules or units may be designed for operation at 100 ohms. Some or all of the modules or unites may be designed for operation at 85 ohms. Some or all of the modules or units may be designed to operate at different impedance levels, such as 92 ohms.

Figure 2:
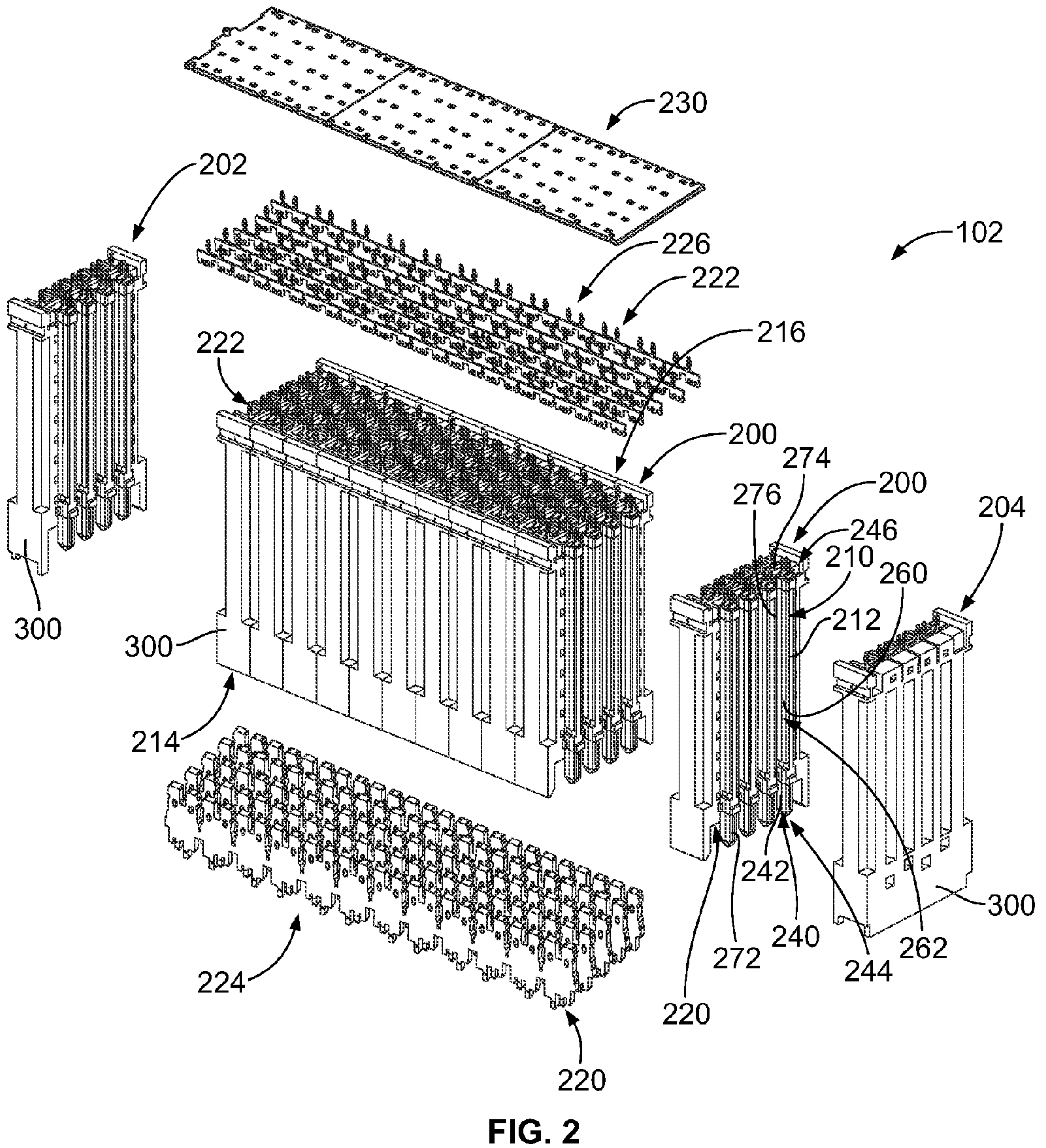
FIG. 2 is an exploded view of a mezzanine header connector of the mezzanine connector assembly that is formed in accordance with an exemplary embodiment.

FIG. 2 is an exploded view of the mezzanine header connector 102 in accordance with an exemplary embodiment. The mezzanine header connector 102 includes a plurality of header modules 200, 202, 204. The header modules 200 define middle header modules, which are flanked on opposite sides by the end header modules 202, 204. Any number of middle header modules 200 may be provided depending on the particular application. The end header modules 202, 204 may be identical to one another, or alternatively may be different from one another. The header modules 200, 202, 204 abut against one another to create continuous perimeter walls of the mezzanine header connector 102. No electrical discontinuities exist between the edges of the header modules 200, 202, 204, which provides shielding entirely around the mezzanine header connector 102.

The header modules 200, 202, 204 hold contact assemblies 210 each having a plurality of header contacts 212. The header modules 200, 202, 204 are stacked adjacent each other in abutting contact with each other to provide electrical shielding for the header contacts 212. In an exemplary embodiment, the header contacts 212 are arranged in pairs that carry differential signals. The header modules 200, 202, 204 surround the individual pairs of header contacts 212 and provide electrical shielding around each of the pairs of header contacts 212. In alternative embodiments, the header contacts 212 may carry single ended signals rather than differential signals. In other alternative embodiments, the header contacts 212 may carry power rather than data signals.

The header contacts 212 extend between a front 214 of the mezzanine header connector 102 and a rear 216 of the mezzanine header connector 102. The front 214 is configured to be mated with the mezzanine receptacle connector 104 (shown in FIG. 1). The rear 216 is configured to be mounted to the first circuit board 106 (shown in FIG. 1). In an exemplary embodiment, the header modules 200, 202, 204 provide electrical shielding for the header contacts 212 along substantially the entire length of the header contacts 212 between the front 214 and the rear 216.

The mezzanine header connector 102 includes a plurality of front header ground shields 220 at the front 214 and a plurality of rear header ground shields 222 at the rear 216. The header ground shields 220, 222 may be inserted into the header modules 200, 202, 204 such that the header ground shields 220, 222 provide electrical shielding for the header contacts 212. The header ground shields 220, 222 may be electrically connected to one or more conductive surfaces of the header modules 200, 202, 204. The header ground shields 220, 222 are configured to be electrically connected to the mezzanine receptacle connector 104 and the first circuit board 106, respectively.

In an exemplary embodiment, the front header ground shields 220 define a front ground lattice 224 to provide shielding around multiple sides of each pair of header contacts 212. For example, the front header ground shields 220 may include both longitudinal components and lateral components that provide shielding between rows and columns of the header contacts 212, as explained in further detail below. The rear header ground shields 222 define a rear ground lattice 226 to provide shielding around multiple sides of each pair of header contacts 212. For example, the rear header ground shields 222 may include both longitudinal components and lateral components that provide shielding between rows and columns of the header contacts 212, as explained in further detail below.

In an exemplary embodiment, the mezzanine header connector 102 includes a pin organizer 230. The pin organizer 230 is configured to be coupled to the rear 216 of the mezzanine header connector 102. The pin organizer 230 includes a plurality of openings therethrough that receive corresponding pins of the header contacts 212 and/or the rear header ground shields 222. The pin organizer 230 holds the relative positions of the header contacts 212 and/or rear header ground shields 222 for mounting to the first circuit board 106 (shown in FIG. 1). The pin organizer 230 may protect the pins of the header contacts 212 and/or the rear header ground shields 222 from damage, such as during shipping, assembly, and/or mounting to the first circuit board 106.

Figure 3:
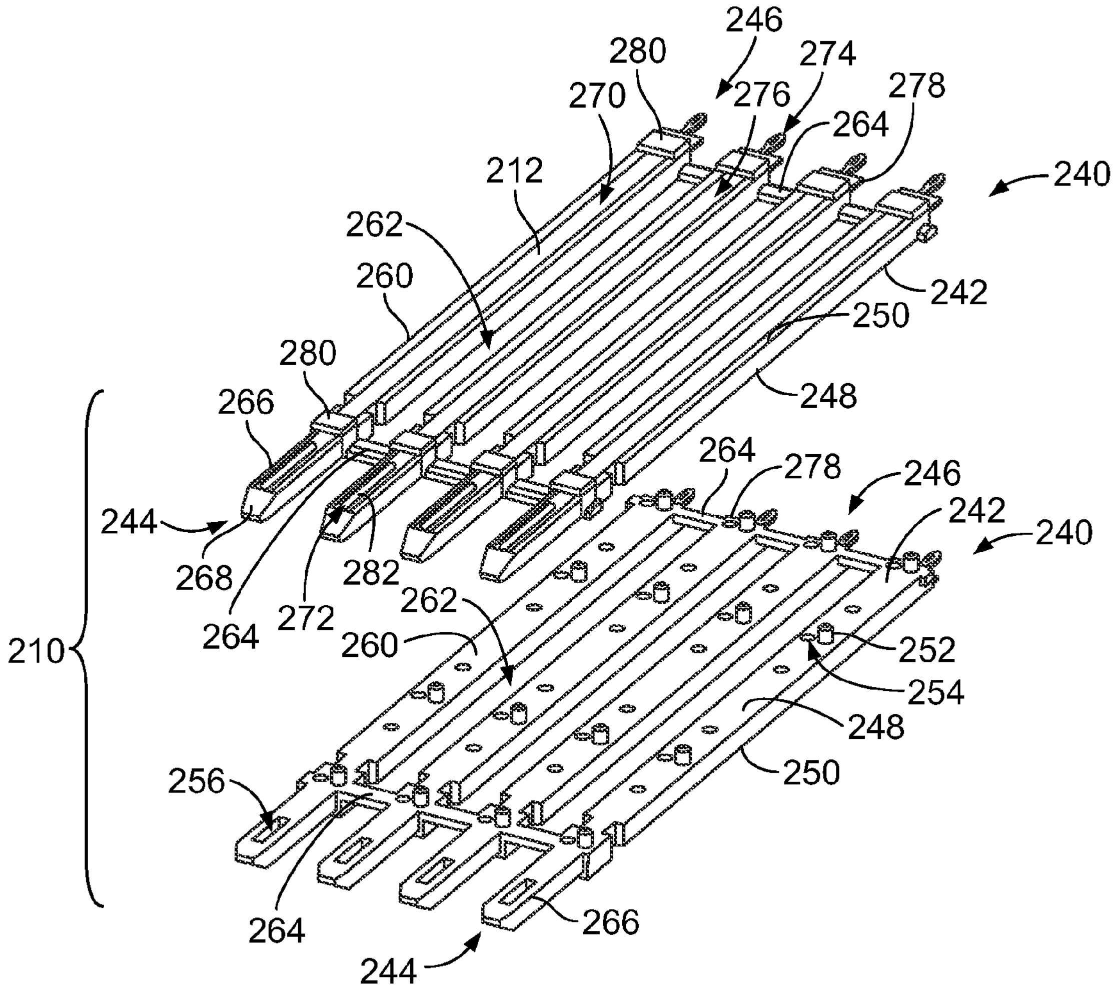
FIG. 3 is an exploded view of a contact assembly of the mezzanine header connector.

FIG. 3 is an exploded view of the contact assembly 210. The contact assembly 210 includes a pair of contact modules 240 arranged back-to-back. The contact modules 240 are shown separated from one another; however the contact modules 240 may be coupled together by pressing the contact modules 240 against each other. In an exemplary embodiment, the contact modules 240 are identical to one another and are inverted 180° relative to one another. Having the contact modules 240 identical minimizes tooling cost. In alternative embodiments, the contact modules 240 may define complementary mating halves of the contact assembly 210 that are similar to one another but include at least some different features, such as for coupling the contact modules 240 together.

Each contact module 240 includes a dielectric holder 242 that holds a plurality of the header contacts 212. In an exemplary embodiment, the dielectric holder 242 is overmolded over and/or around a leadframe 243 (shown in FIG. 4) that includes the header contacts 212. The header contacts 212 may be coupled to the dielectric holder 242 by other methods other than overmolding in alternative embodiments.

Each dielectric holder 242 extends between a mating end 244 and a mounting end 246 opposite the mating end 244. The mating end 244 is configured to be mated with the mezzanine receptacle connector 104 (shown in FIG. 1), while the mounting end 246 is configured to be coupled to the first circuit board 106 (shown in FIG. 1).

Each dielectric holder 242 has an inner side 248 and an outer side 250. The inner sides 248 of the pair of dielectric holders 242 abut against each other when the contact modules 240 are coupled together. The inner sides 248 may be generally flat allowing the inner sides 248 of the pair of dielectric holders 242 to sit flush with one another.

Each dielectric holder 242 includes posts 252 extending from the inner side 248 and openings 254 formed in the inner side 248. When the contact modules 240 are coupled together, the posts 252 are aligned with corresponding openings 254 in the other dielectric holder 242 and pressed into the openings 254 to securely couple the contact modules 240 together. For example, the posts 252 may be held in corresponding openings 254 by an interference fit. Other securing features may be used in alternative embodiments, such as fasteners, clips, latches, adhesives, and the like. In alternative embodiments, rather than both dielectric holders 242 including posts 252 and openings 254, one of the dielectric holders 242 may include the posts 252 while the other dielectric holder 242 may include the openings 254.

Each dielectric holder 242 may include pockets 256 open along the inner side 248. The pockets 256 may be filled with air. The pockets 256 may be aligned with the header contacts 212 to affect electrical characteristics, such as the impedance, of the signal or transmission lines defined by the header contacts 212. The length and proximity of the pockets 256 to the header contacts 212 may be selected to affect the impedance or other electrical characteristics.

Each dielectric holder 242 includes a plurality of rails 260 separated by gaps 262. Each rail 260 holds a corresponding header contact 212. The rails 260 are connected by connecting segments 264 that hold the positions of the rails 260 relative to one another. In an exemplary embodiment, the dielectric holder 242 is molded and the connecting segments 264 are formed by portions of the mold that allow the dielectric material to flow between the various rails 260. Any number of rails 260 may be provided depending on the particular application and the number header contacts 212 associated with the contact module 240. In the illustrated embodiment, four rails 260 are provided to support the four header contacts 212. The rails 260 extend along generally linear paths between the mating end 244 and the mounting end 246. At the mating end 244, the rails 260 define front support beams 266 that are cantilevered forward of the connecting segments 264. The front support beams 266 support portions of the header contacts 212. The front support beams 266 have ramped lead-ins 268 that lead to the header contacts 212. The lead-ins 268 prevent stubbing when the contact assembly 210 is mated with the mezzanine receptacle connector 104 (shown in FIG. 1).

In an exemplary embodiment, the header contacts 212 are exposed along the outer side 250 of the dielectric holder 242. For example, the dielectric holder 242 is overmolded around the header contacts 212 such that side surfaces 270 of the header contacts 212 are flush with and exposed at the outer side 250.

In an alternative embodiment, rather than having two dielectric holders 242 arranged back-to-back, the contact assembly 210 may include a single dielectric holder 242. The single dielectric holder 242 may have header contacts 212 arranged along both sides, or alternatively along only one side.

Figure 4:
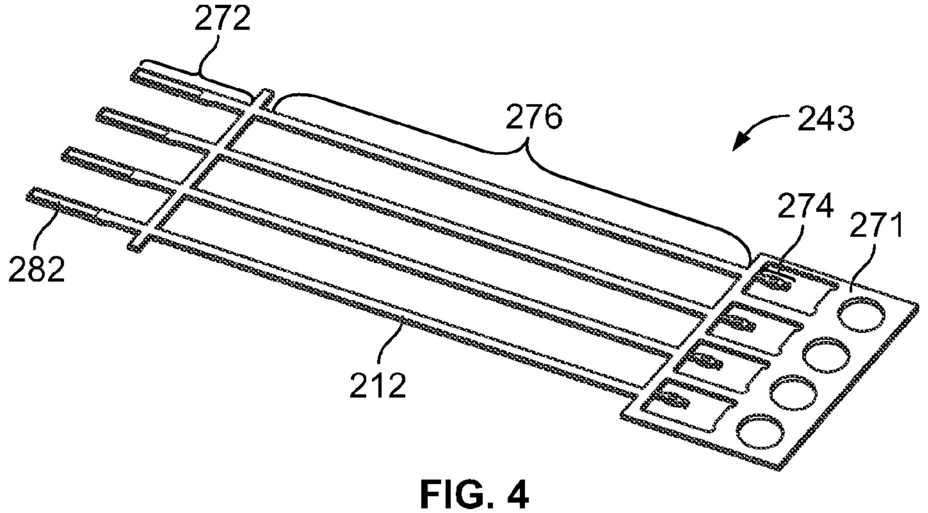
FIG. 4 is a perspective view of a leadframe of the contact assembly.

FIG. 4 is a perspective view of the leadframe 243 of header contacts 212 in accordance with an exemplary embodiment.

The leadframe 243 includes a carrier 271 that holds the header contacts 212 together. The leadframe 243 is stamped and formed from a blank and configured to be overmolded by the dielectric holder (shown in FIG. 3).

With additional reference back to FIG. 3, in an exemplary embodiment, the header contacts 212 include mating segments 272, terminating segments 274, and intermediate segments 276 extending between the mating segments 272 and terminating segments 274. The header contacts 212 extend along generally linear paths from the mating segments 272, along the intermediate segments 276, to the terminating segments 274. In an exemplary embodiment, at least a portion of each intermediate segment 276 is exposed along the outer side 250. Optionally, a majority of the length of each intermediate segment 276 is exposed to air along the outer side 250.

The mating segments 272 are exposed along the outer side 250 at the mating end 244 for termination to corresponding receptacle contacts (not shown) of the mezzanine receptacle connector 104 (shown in FIG. 1). For example, the mating segments 272 are exposed along the front support beams 266. In the illustrated embodiment, the mating segments 272 include convex interference bumps 282. The interference bumps 282 may be formed by pressing or coining the header contacts 212 to give the header contacts 212 a rounded shape to define a mating interface for mating with corresponding receptacle contacts of the mezzanine receptacle connector 104 (shown in FIG. 1). The convex interference bumps 282 may lower the resistance at the mating interface with the mating contacts of the mezzanine receptacle connector 104 by providing a smaller surface area and thus higher mating pressure between the header contacts 212 and the receptacle contacts of the mezzanine receptacle connector 104. Optionally, the interference bumps 282 may be plated, such as with gold plating.

The terminating segments 274 extend from the mounting end 246 beyond a rear edge 278 of the dielectric holder 242 for termination to the first circuit board 106 (shown in FIG. 1). The terminating segments 274 are exposed exterior of the dielectric holder 242. Optionally, the terminating segments 274 may be plated with a plating material, such as tin plating. In the illustrated embodiment, the terminating segments 274 include compliant pins, such as eye-of-the-needle pins, that are configured to be terminated to the first circuit board 106 by pressing the compliant pins into plated vias of the first circuit board 106. Other types of terminating segments may be provided in alternative embodiments, such as solder tails, solder balls, deflectable spring beams, and the like.

In the illustrated embodiment, the dielectric holder 242 includes caps 280 that extend over portions of the intermediate segments 276 to secure the header contacts 212 in the dielectric holder 242. Optionally, the caps 280 may be aligned with the connecting segments 264. The caps 280 may cover opposite ends of the intermediate segments 276, such as at the intersections of the intermediate segments 276 with the mating segments 272 and with the terminating segments 274. The caps 280 may be positioned proximate to the areas of the header contacts 212 that are trimmed or cut from the carrier 271 of the leadframe that initially holds the header contacts 212 together prior to overmolding.

With additional reference back to FIG. 2, when the contact modules 240 of the pair are coupled together, the rails 260 are aligned back-to-back. The mating segments 272 are aligned with one another on opposite sides of the contact module 240. The header contacts 212 on opposite sides of the contact assembly 210 define differential pairs of header contacts 212. The gaps 262 are provided between differential pairs of the header contacts 212 to allow portions of the header modules 200, 202, 204 (shown in FIG. 2) to pass between adjacent differential pairs of the header contacts 212. The header modules 200, 202, 204 provide electrical shielding between pairs of the header contacts 212, such that each pair of header contacts 212 is electrically shielded from each other pair.

In an exemplary embodiment, a length of the contact module 240 between the mating end 244 and mounting end 246 of the dielectric holder 242 is scalable to change a height of the mezzanine header connector 102 (shown in FIG. 2). For example, lengths of the rails 260 may be varied by preselecting a specific length as desired to change the spacing between the mating end 244 and mounting end 246. Similarly, the lengths of the header contacts 212 may also be scalable to coincide with the lengths of the dielectric holder 242. For example, the lengths of the intermediate segments 276 may be pre-selectively lengthened or shortened to change the spacing between the mating segments 272 and terminating segments 274.

In an exemplary embodiment, the dielectric material of the dielectric holder 242 may be selectable to change an impedance of the contact assembly 210. For example, for a given spacing between the header contacts 212, changing the dielectric material of the dielectric holder 242 may change the impedance of the transmission lines of the header contacts 212. For example, in a first embodiment, a first dielectric material having a dielectric constant of approximately 3.5 may be used to achieve a target impedance of approximately 100 ohms. In a second embodiment, a second and different dielectric material having a dielectric constant of approximately 5.1 may be selected to achieve a target impedance of approximately 85 ohms. The impedance may be changed without changing the geometry of the header contacts 212, but rather merely changing the dielectric material of the dielectric holder 242. Using a material having a higher dielectric constant lowers the impedance of the transmission lines of the header contacts 212. Different target impedance values may be achieved without any tooling change to the headers contacts 212 or the mold used to form the dielectric holder 242.

Figure 5:
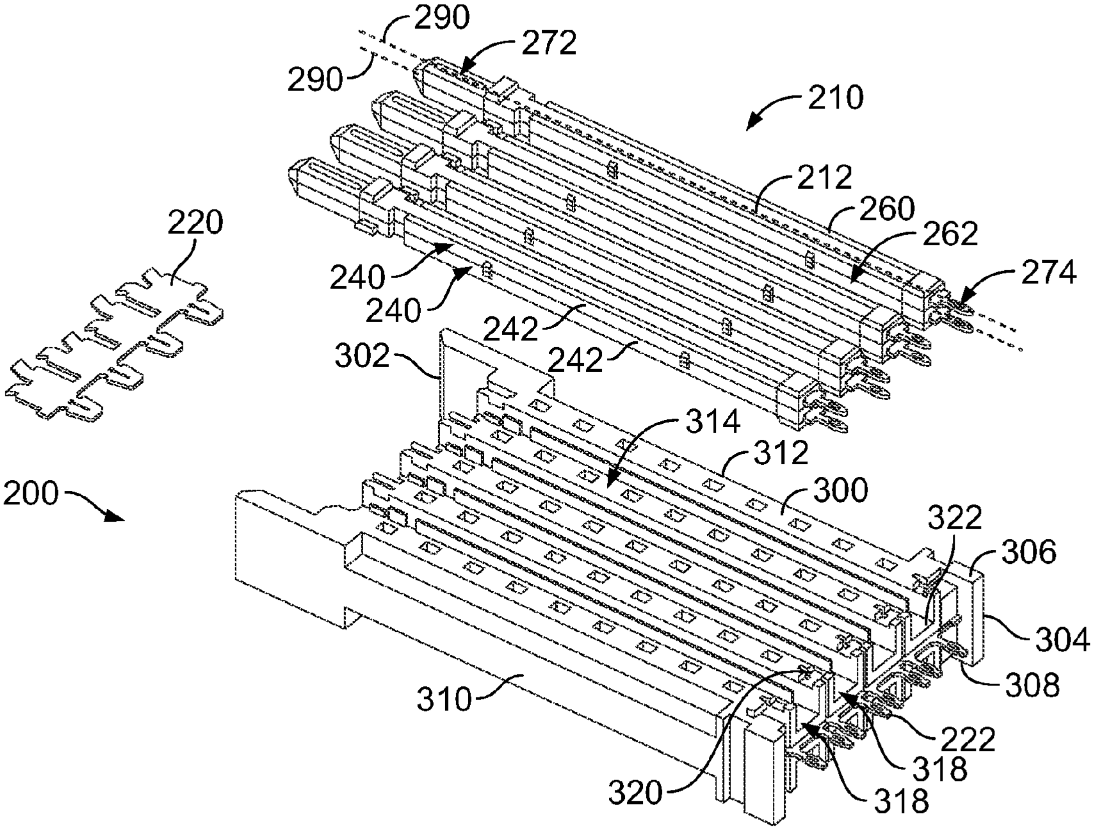
FIG. 5 is an exploded view of a header module of the mezzanine header connector and formed in accordance with an exemplary embodiment.
Figure 6:
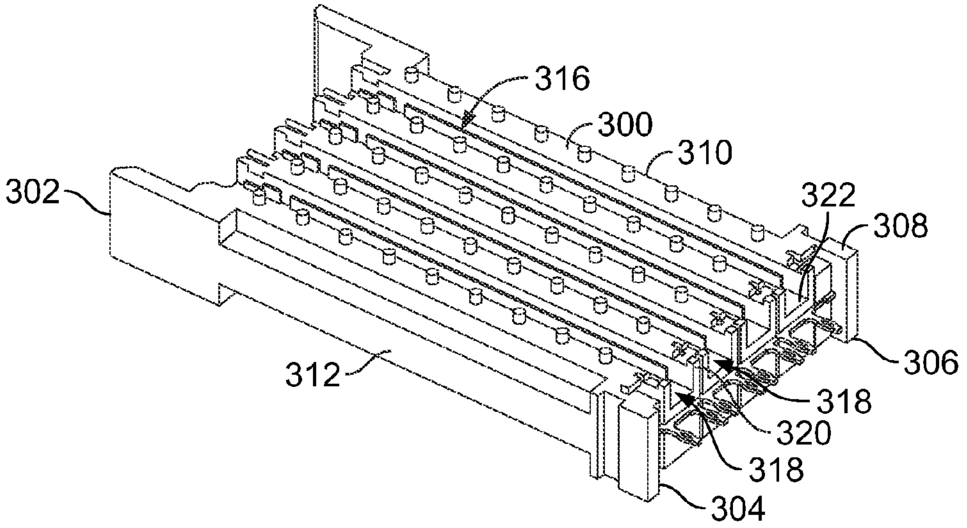
FIG. 6 shows a portion of the header module shown in FIG. 5.

FIG. 5 is an exploded view of the middle header module 200 formed in accordance with an exemplary embodiment. FIG. 6 shows a portion of the middle header module 200. FIG. 5 shows the contact assembly 210 in an assembled state with the pair of contact modules 240 coupled together. As noted above, the header contacts 212 are arranged in pairs on opposites sides of the contact assembly 210. In an exemplary embodiment, each of the header contacts 212 extends parallel to one another along respective contact axes 290. The header contacts 212 within each pair are separated from each other by the dielectric material of the pair of dielectric holders 242. Adjacent pairs of header contacts 212 are separated from each other by the gaps 262 between the corresponding rails 260.

The middle header module 200 includes a housing frame 300 that receives and supports the contact assembly 210. FIG. 5 shows the housing frame 300 from one side while FIG. 6 shows the housing frame 300 from the opposite side. In an exemplary embodiment, the housing frame 300 is conductive and provides electrical shielding for the header contacts 212 of the contact assembly 210. For example, the housing frame 300 may be manufactured from a metalized plastic material, a plated plastic material, a die cast metal material, and the like. The housing frame 300 extends between a front or mating end 302 and a rear or mounting end 304 opposite the front end 302. The housing frame 300 includes opposite first and second sides 306, 308 and opposite first and second edges 310, 312 that extend between the first and second sides 306, 308. The edges 310, 312 define an exterior of the mezzanine header connector 102 (shown in FIG. 2). In an exemplary embodiment, the edges 310, 312 may abut against edges 310, 312 of an adjacent header frame 300 to create continuous perimeter walls of the mezzanine header connector 102 (see, for example, FIG. 2). The first and second sides 306, 308 face other header modules 200, 202, 204 when assembled.

In an exemplary embodiment, the housing frame 300 includes a first chamber 314 (FIG. 5) in the first side 306. The first chamber 314 receives the contact assembly 210. Optionally, a second chamber 316 (FIG. 6) may be provided in the second side 308 that receives a portion of a contact assembly 210 of an adjacent header module 200 or 202 (shown in FIG. 2). Optionally, when the contact assembly 210 is received in the first chamber 314, a portion of the contact assembly 210 may extend beyond the first side 306. For example, one of the contact modules 240 may be received within the first chamber 314 while the other contact module 240 of the contact assembly 210 may be positioned exterior of the first chamber 314 for reception into a second chamber 316 of an adjacent header module 200.

In an exemplary embodiment, the first chamber 314 is divided into discrete pockets 318 by tabs 320 that extend into the first chamber 314. The tabs 320 are configured to be received in corresponding gaps 262 between the rails 260 of at least one of the contact modules 240. The tabs 320 provide electrical shielding between the header contacts 212 associated with the rails 260 received in the pockets 318 on opposite sides of the tabs 320. The tabs 320 define walls that are positioned between header contacts 212 of different pairs of the header contacts 212. The housing frame 300 includes interior walls 322 positioned at the interior of the first chamber 314. The interior walls 322 and associated tabs 320 surround the differential pairs of header contacts 212 to provide electrical shielding for the differential pairs of header contacts 212. The second chamber 316 may include similar tabs 320 and pockets 318.

The front header ground shields 220 are configured to be coupled to the front end 302 of the housing frame 300. For example, the housing frame 300 may include a slot or channel that receives the front header ground shields 220. Alternatively, at least some of the front header ground shields 220 may be embedded in the housing frame 300, such as by being overmolded by the housing frame 300. The rear header ground shields 222 are provided at the rear end 304 of the housing frame 300. Optionally, the rear header ground shield 222 may be molded into the rear end 304 such that portions of the housing frames 300 surround the rear header ground shield 222. Alternatively, the rear header ground shields 222 may be separate from the housing frame 300 and inserted into the housing frame 300. Mounting pins of the rear header ground shield 222 may extend beyond the rear end 304 for termination to the first circuit board 106 (shown in FIG. 1). Other header ground shields 220, 222 may be coupled to the header ground shields 220, 222, such as to create the ground lattices 224, 226 (shown in FIG. 2) at both the front end 302 and the rear end 304, respectively, of the housing frame 300 to provide circumferential shielding around the pairs of header contacts 212 at the mating and terminating segments 272, 274 of the header contacts 212.

Figure 7:
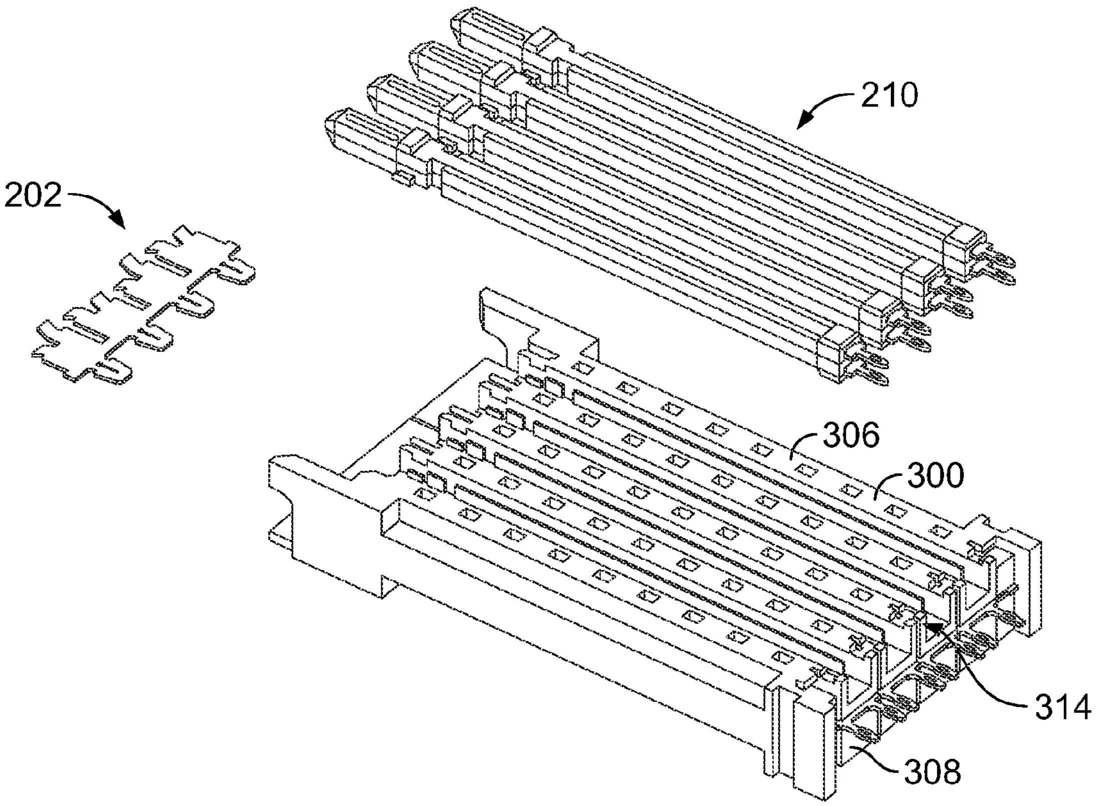
FIG. 7 is an exploded view of another header module of the mezzanine header connector and formed in accordance with an exemplary embodiment.

FIG. 7 is an exploded view of the end header module 202 in accordance with an exemplary embodiment. The end header module 202 may be similar to the middle header module 200 (shown in FIG. 5). However, the end header module 202 receives a contact assembly 210 on only one side of the end header module 202. The other side of the end header module 202 defines an exterior of the mezzanine header connector 102 (shown in FIG. 2), which may define a perimeter wall of the mezzanine header connector 102. Similar components of the end header module 202 and the middle header module 200 are identified with similar terms and reference numerals.

The end header module 202 includes the housing frame 300 having the first chamber 314 at the first side 306; however the housing frame 300 of the end header module 202 does not include a second chamber at the second side 308. When the contact assembly 210 is loaded into the first chamber 314, a portion of the contact assembly 210 extends beyond the first side 306. Such portion of the contact assembly 210 is configured to be received in a middle header module 200 that is positioned adjacent to the end header module 202 (see, for example, FIG. 2).

Figure 8:
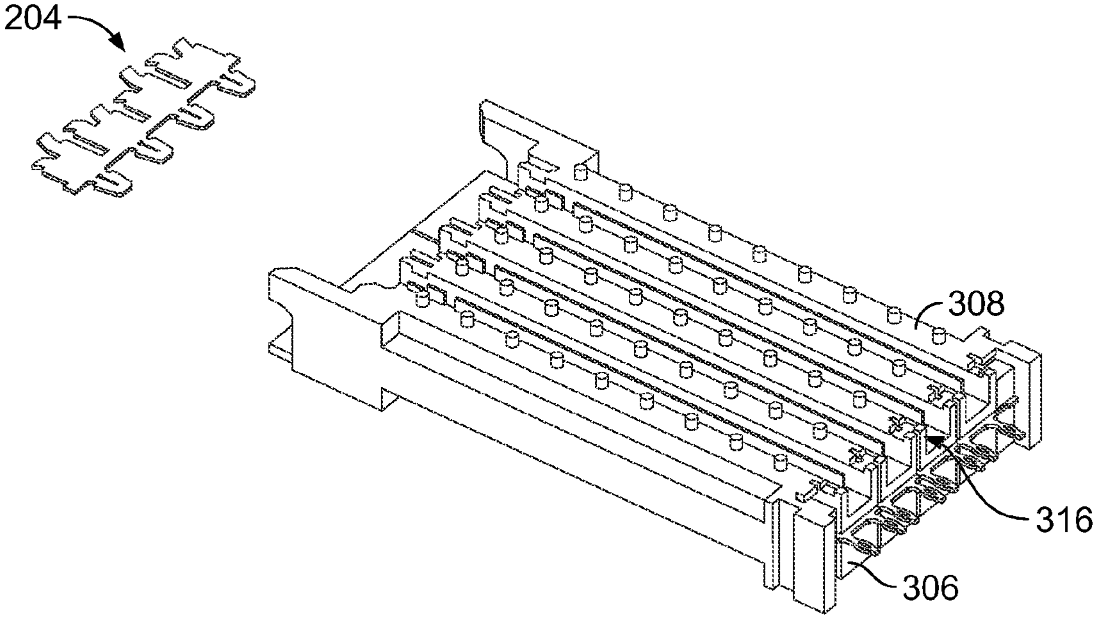
FIG. 8 is an exploded view of another header module of the mezzanine header connector and formed in accordance with an exemplary embodiment.

FIG. 8 is an exploded view of the end header module 204 in accordance with an exemplary embodiment. The end header module 204 may be similar to the middle header module 200 (shown in FIG. 5). However, the end header module 204 receives a contact assembly 210 (shown in FIG. 5) on only one side of the header module 204. Similar components of the end header module 204 and the middle header module 200 are identified with similar terms and reference numerals.

The end header module 204 includes the second chamber 316 at the second side 308; however, the end header module 204 does not include a first chamber at the first side 306. In contrast, the first side 306 defines an exterior of the mezzanine header connector 102 (shown in FIG. 2), which may define a perimeter wall of the mezzanine header connector 102. The second chamber 316 does not receive its own contact assembly 210 (shown in FIG. 5), but rather the second chamber 316 is configured to receive a portion of the contact assembly 210 that extends from the middle header module 200 positioned adjacent the end header module 204 when the end header module 204 is coupled thereto (see, for example, FIG. 2).

Figure 9:
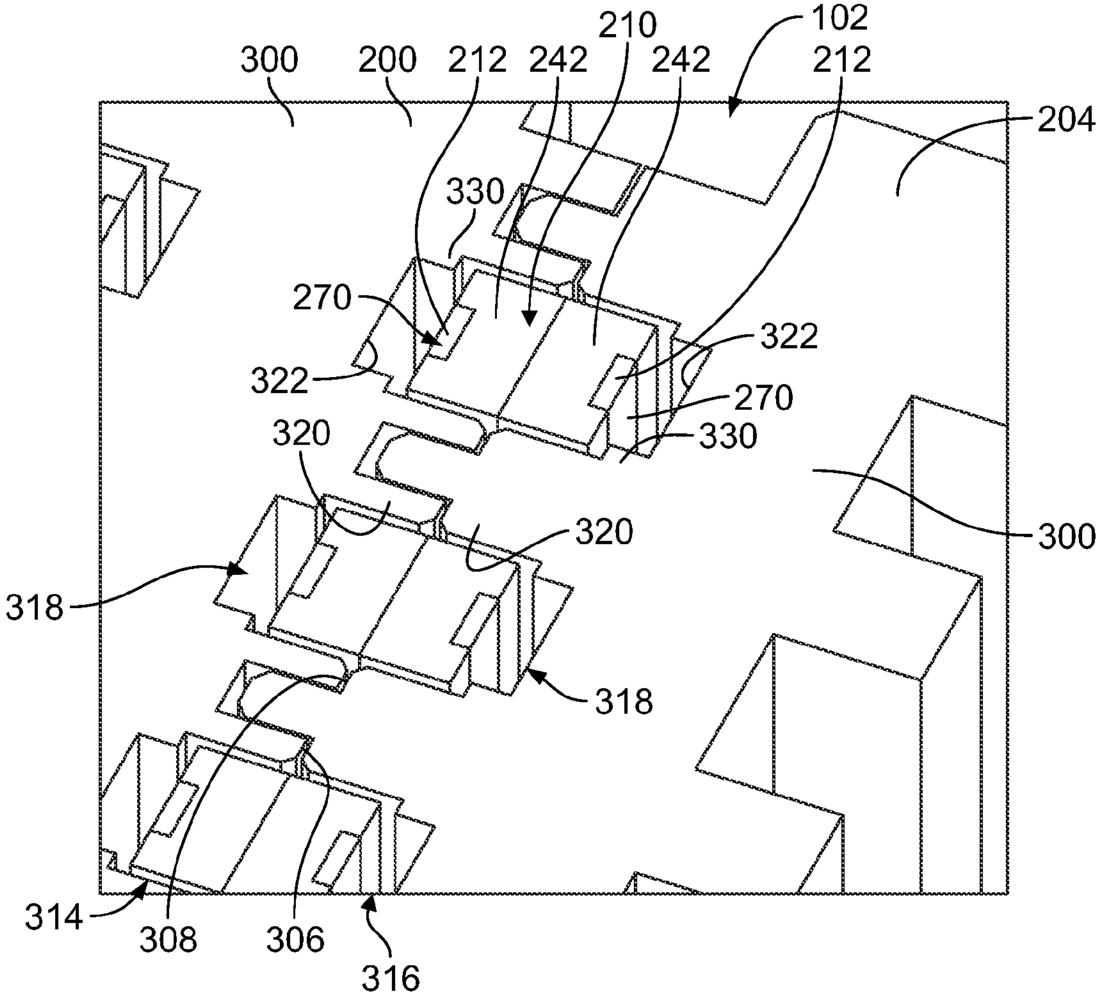
FIG. 9 is a cross-sectional view of a portion of the mezzanine header connector showing various header modules coupled together.

FIG. 9 is a cross-sectional view of a portion of the mezzanine header connector 102 showing the end header module 204 coupled to one of the middle header modules 200. The middle header module 200 holds one of the contact assemblies 210 along the first side 306 thereof. The second side 308 of the end header module 204 is coupled to the first side 306 of the middle header module 200 to receive a portion of the contact assembly 210. When assembled, the contact assembly 210 is held in corresponding pockets 318 of the first chamber 314 of the middle header module 200 and in the pockets 318 of the second chamber 316 of the end header module 204.

The housing frames 300 of the middle header module 200 and the end header module 204 provide electrical shielding around each of the differential pairs of header contacts 212. Each of the pairs of the header contacts 212 is entirely circumferentially surrounded by conductive material of the housing frames 300 to provide 360° shielding along substantially the entire length of the header contacts 212. The contact assembly 210 is arranged in the housing frames 300 such that the side surfaces 270 of the header contacts 212 face the interior walls 322 of the housing frames 300 of the middle header module 200 and the end header module 204. The header contacts 212 are separated from the interior walls 322 by air gaps in the pockets 318.

In an exemplary embodiment, the pockets 318 have shoulders 330 at the corners between the tabs 320 and the interior walls 322. The dielectric holders 242 may abut against the shoulders 330 to locate the contact assembly 210 in the pockets 318. In an exemplary embodiment, the only dielectric material between the header contacts 212 and the housing frames 300 is air. Electrical characteristics of the transmission lines defined by the header contacts 212 may be adjusted by changing the spacing between the header contacts 212 in the interior walls 322. As noted above, electrical characteristics of the transmission lines of the header contacts 212 may be modified by selecting an appropriate dielectric material for the dielectric holders 242 between the header contacts 212. Changing the dielectric material allows the impedance of the header connector 102 to be tuned, such as for matching the impedance to a particular target value, such as 100 ohms, 85 ohms, 92 ohms, or another value.

Figure 10:
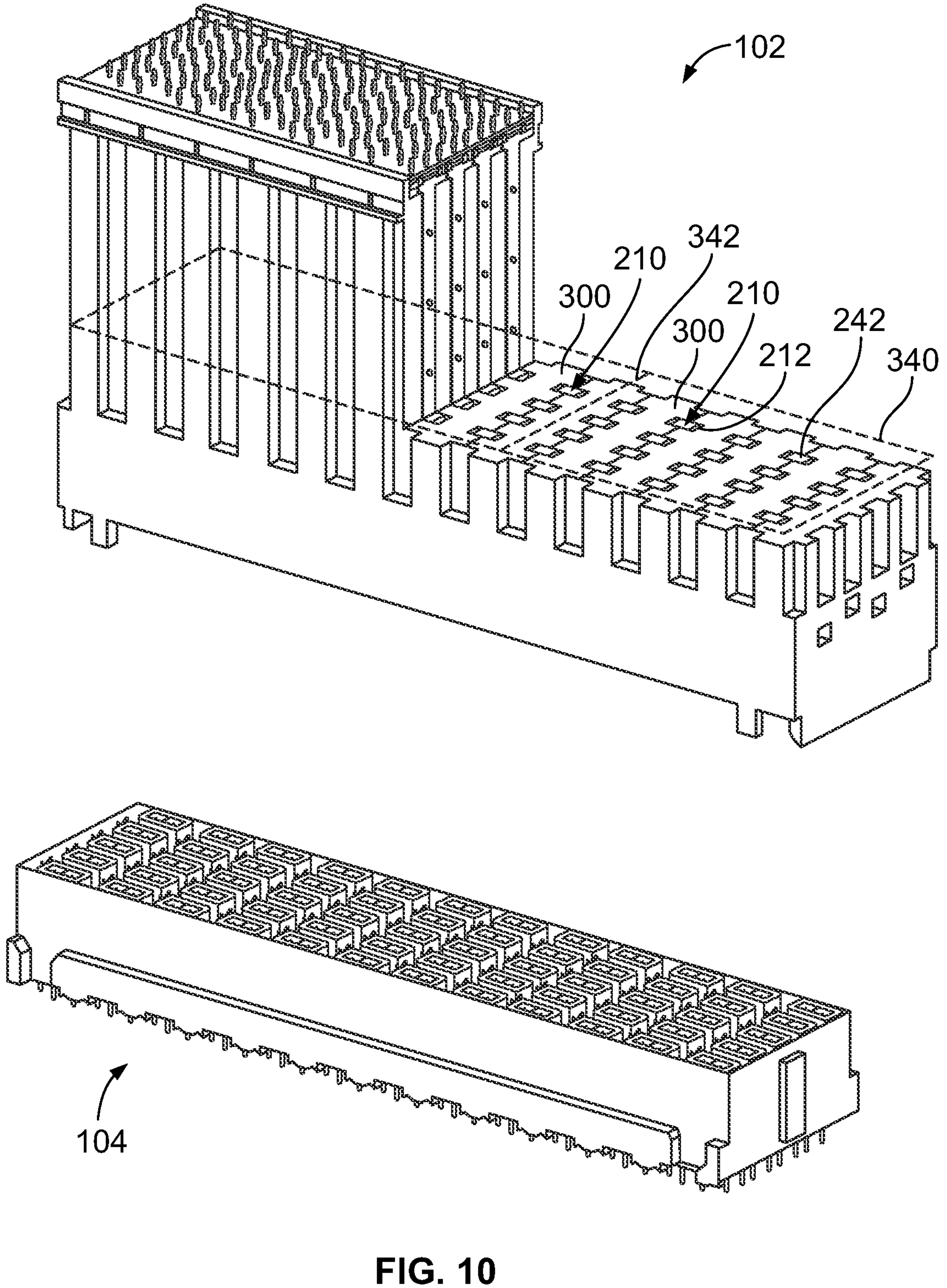
FIG. 10 is a partial sectional view of the mezzanine header connector showing contact assemblies in various housing frames.

FIG. 10 is a partial sectional view of the mezzanine header connector 102 showing contact assemblies 210 in various housing frames 300. As noted above, electrical characteristics of the transmission lines of the header contacts 212 may be modified by selecting an appropriate dielectric material for the dielectric holders 242.

In an exemplary embodiment, the contact assemblies 210 may be different from one another, such as having dielectric holders 242 that are made from different materials such that transmission lines of the header contacts 212 of different contact assemblies 210 may operate at different impedance levels. For example, the mezzanine header connector 102 may include a first set of contact assemblies 210, general identified at reference 340, and a second set of contact assemblies 210, generally identified at reference 342. The first set of contact assemblies 340 operate at a first impedance, while the second set of contact assemblies 342 operate at a second impedance. For example, the dielectric holders 242 of the first set of contact assemblies 340 are manufactured from a first material, while the dielectric holders 242 of the second set of contact assemblies 342 are manufactured from a second material different from the first material. The second material may have a dielectric constant less than a dielectric constant of the first material. In an exemplary embodiment, the shapes of the dielectric holders 242 of the first and second sets of contact assemblies 340, 342 are identical and the orientations of the header contacts 212 of the first and second sets of contact assemblies 340, 342 are identical. The only difference between the first and second sets of contact assemblies 340, 342 is that the material of the dielectric holders 242 is different, which changes the impedance of the transmission lines. In one particular example, the first set of contact assemblies 340 may be designed to operate at 85 ohms while the second set of contact assemblies 342 are designed to operate at 100 ohms. Optionally, approximately half of the contact assemblies 210 are within the first set of contact assemblies 340 and approximately half of the contact assemblies 210 are within the second set of contact assemblies 342. The impedance of the mezzanine header connector 102 may be approximately 92 ohms when the first set of contact assemblies 340 operates at 85 ohms and when the second set of contact assemblies 342 operates at 100 ohms. The mezzanine receptacle connector 104 may be designed to operate at 92 ohms, or may be split to operate at different impedance levels similar to the mezzanine header connector 102.

Figure 11:
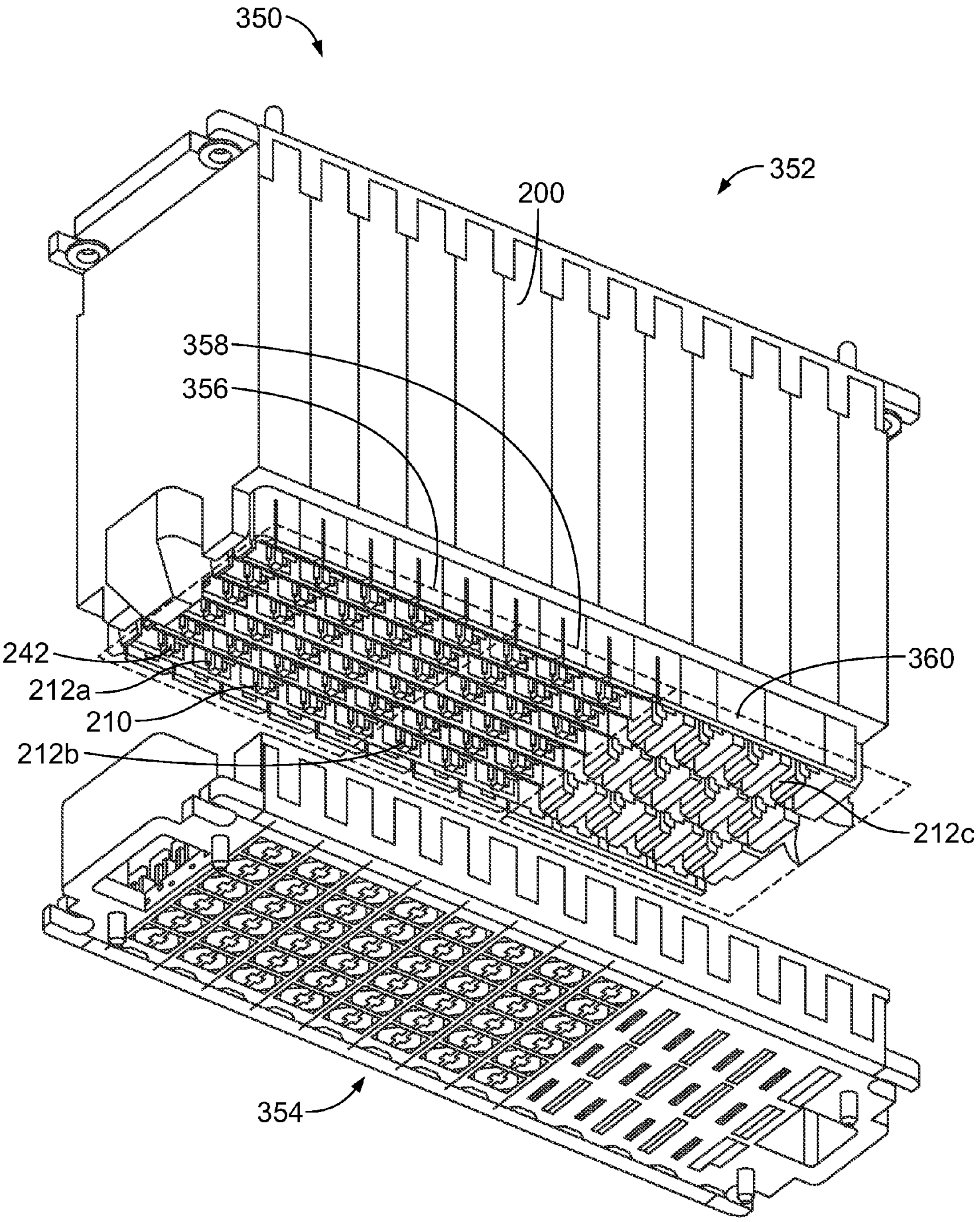
FIG. 11 is a perspective view of a mezzanine connector assembly formed in accordance with an exemplary embodiment.

FIG. 11 is a perspective view of a mezzanine connector assembly 350 formed in accordance with an exemplary embodiment and including a mezzanine header connector 352 and a mezzanine receptacle connector 354. The mezzanine header connector 352 may be similar to the mezzanine header connector 102 (shown in FIG. 1) and like components are identified with like reference numerals. The mezzanine header connector 352 is modular in design and may include any number of header modules 200 that may carry differential pairs of header contacts 212*a*, single ended header contacts 212*b* or power header contacts 212*c*.

The mezzanine header connector 352 includes a first set of contact assemblies 210 identified generally by reference 356, a second set of contact assemblies 210 identified generally by reference 358; and a third set of contact assemblies 210 identified generally by reference 360. The first set of contact assemblies 356 includes header contacts 212*a* arranged in pairs and configured to carry differential pair data signals. The second set of contact assemblies 358 includes header contacts 212*b* that are configured to carry single ended data signals. The header contacts 212*b* of the second set of contact assemblies 358 may be arranged along both sides of the corresponding dielectric holder 242, or alternatively may be arranged on a single side of the dielectric holder 242. The header contacts 212*c* of the third set of contact assemblies 360 define power contacts 212*c* configured to carry power. The power contacts 212*c* may be sized and shaped differently than the signal contacts 212*a*, 212*b* of the first and second sets of contact assemblies 356, 358.

With reference back to FIG. 2, the mezzanine header connector 102 includes conductive pieces that provide electrical shielding for the header contacts 212. For example, the housing frames 300 are conductive and provide shielding along substantially the entire lengths of the header contacts 212. Additionally, the front ground lattice 224 of front header ground shields 220 and the rear ground lattice 226 of rear header ground shields 222 provide electrical shielding for the header contacts 212 at the interfaces with the mezzanine receptacle connector 104 (shown in FIG. 1) and circuit board 106 (shown in FIG. 1), respectively.

The sizes, shapes, and positions of the header ground shields 220, 222 may take many different forms in different embodiments. Examples of the header ground shields 220, 222 are described below with reference to FIGS. 12 through 25. In exemplary embodiments, the header ground shields 220, 222 provide good electrical connection to the housing frames 300. The header ground shields 220, 222 provide robust interfaces for the mezzanine receptacle connector 104 and the first circuit board 106, respectively.

In an exemplary embodiment, the mezzanine header connector 102 includes both longitudinal header ground shields and lateral header ground shields that extend along columns and rows of the ground lattices 224, 226 between the pairs of header contacts 212 to provide electrical shielding for the header contacts 212.

Figure 12:
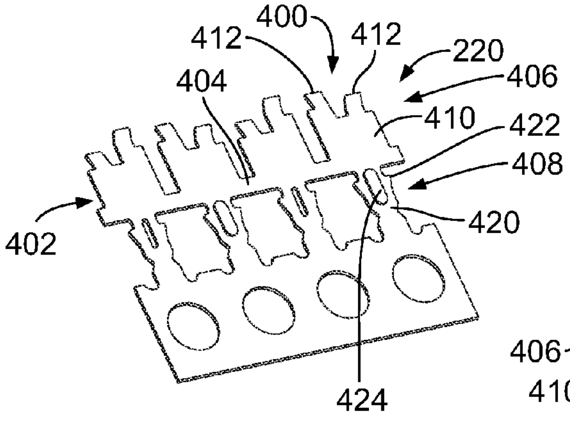
FIG. 12 illustrates a plurality of front header ground shields formed in accordance with an exemplary embodiment.
Figure 13:
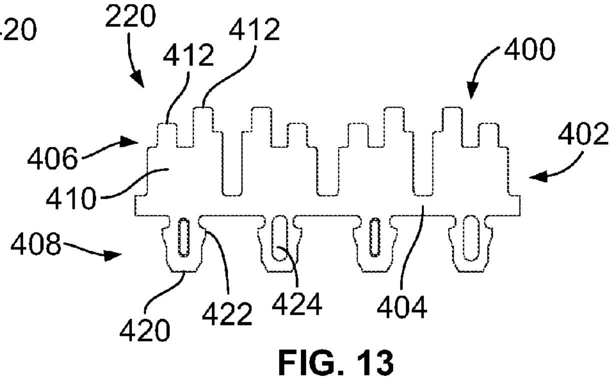
FIG. 13 is a side view of the front header ground shields.

FIG. 12 illustrates a plurality of front header ground shields 220 formed in accordance with an exemplary embodiment. FIG. 12 illustrates the front header ground shields 220 on a carrier which is configured to be later removed. FIG. 13 is a side view of the front header ground shields 220 with the carrier removed. In an exemplary embodiment, the front header ground shields 220 are configured to be loaded into the mezzanine header connector 102 (shown in FIG. 2) and extend laterally across the mezzanine header connector 102. As such, the front header ground shields 220 define lateral header ground shields, which may be referred to hereinafter as lateral header ground shields 400.

A plurality of the lateral header ground shields 400 are arranged together as part of a common lateral header ground shield strip 402. The lateral header ground shield strip 402 may include any number of the lateral header ground shields 400. The lateral header ground shield strip 402 includes bridges 404 extending between adjacent lateral header ground shields 400. The widths of the bridges 404 control the lateral spacing of the lateral header ground shields 400. The lateral header ground shields 400 each include a mating end 406 and a frame end 408 opposite the mating end 406. The mating end 406 is configured to be mechanically and electrically coupled to a corresponding receptacle ground shield (not shown) of the mezzanine receptacle connector 104 (shown in FIG. 1). The frame end 408 is configured to be mechanically and electrically connected to the housing frame 300 (shown in FIG. 2).

In the illustrated embodiment, the mating end 406 includes a blade 410 that is generally planar. The blade 410 is configured to be plugged into the mezzanine receptacle connector 104 during mating for electrical connection to the corresponding receptacle ground shield. In an exemplary embodiment, the lateral header ground shields 400 include fingers 412 extending from corresponding blades 410. The fingers 412 may be bent and angled out of the plane of the blade 410. The fingers 412 may be used to guide mating with the receptacle ground shields. Optionally, each blade 410 may include multiple fingers 412. Optionally, the fingers 412 may be angled in opposite directions, which may balance mating forces during mating. In an exemplary embodiment, the fingers 412 have different lengths such that the tips of the fingers 412 are at different distances from the blade 410. Having different length fingers 412 staggers the mating interfaces of the fingers 412 with the receptacle ground shields, which reduces the mating force for mating the mezzanine header connector 102 with the mezzanine receptacle connector 104.

The frame end 408 includes a tab 420 that is configured to be received in the corresponding housing frame 300 (shown in FIG. 2). The tab 420 includes projections 422 extending from the sides of the tab 420. The projections 422 may dig into the housing frame 300 to hold the lateral header ground shield 400 in the housing frame 300 by an interference fit. The tab 420 includes an interference bump 424. The interference bump 424 is configured to engage the housing frame 300 to hold the lateral header ground shield 400 in the housing frame 300 by an interference fit. Optionally, the interference bumps 424 on adjacent tabs 420 may extend in opposite directions, which may balance forces when loading the lateral header ground shield strip 402 into the housing frame 300 and/or to position the lateral header ground shield strip 402 within the housing frame 300.

Figure 14:
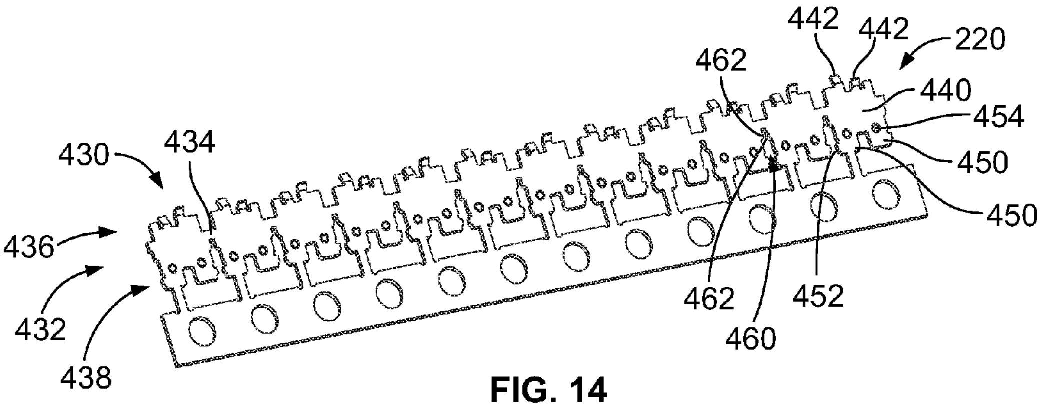
FIG. 14 illustrates a plurality of front header ground shields formed in accordance with an exemplary embodiment.
Figure 15:
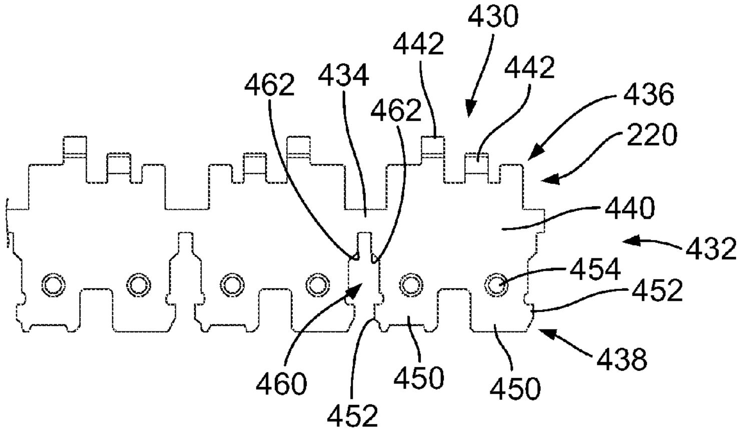
FIG. 15 is a side view of a subset of the front header ground shields.

FIG. 14 illustrates a plurality of front header ground shields 220 formed in accordance with an exemplary embodiment. FIG. 14 illustrates the front header ground shields 220 on a carrier which is configured to be later removed. FIG. 15 is a side view of a subset of the front header ground shields 220 with the carrier removed. In an exemplary embodiment, the front header ground shields 220 are configured to be loaded into the mezzanine header connector 102 (shown in FIG. 2) and extend longitudinally across the mezzanine header connector 102. As such, the front header ground shields 220 define longitudinal header ground shields, which may be referred to hereinafter as longitudinal header ground shields 430.

A plurality of the longitudinal header ground shields 430 are arranged together as part of a common longitudinal header ground shield strip 432. The longitudinal header ground shield strip 432 may include any number of the longitudinal header ground shields 430. The longitudinal header ground shield strip 432 includes bridges 434 extending between adjacent longitudinal header ground shields 430. The widths of the bridges 434 control the longitudinal spacing of the longitudinal header ground shields 430. The longitudinal header ground shields 430 each include a mating end 436 and a frame end 438 opposite the mating end 436. The mating end 436 is configured to be mechanically and electrically coupled to a corresponding receptacle ground shield (not shown) of the mezzanine receptacle connector 104 (shown in FIG. 1). The frame end 438 is configured to be mechanically and electrically connected to the housing frame 300 (shown in FIG. 2).

In the illustrated embodiment, the mating end 436 includes a blade 440 that is generally planar. The blade 440 is configured to be plugged into the mezzanine receptacle connector 104 during mating for electrical connection to the corresponding receptacle ground shield. In an exemplary embodiment, the longitudinal header ground shields 430 include fingers 442 extending from corresponding blades 440. The fingers 442 may be bent and angled out of the plane of the blade 440. The fingers 442 may be used to guide mating with the receptacle ground shields. Optionally, each blade 440 may include multiple fingers 442. Optionally, the fingers 442 may be angled in opposite directions, which may balance mating forces during mating. In an exemplary embodiment, the fingers 442 have different lengths such that the tips of the fingers 442 are at different distances from the blade 440. Having different length fingers 442 staggers the mating interfaces of the fingers 442 with the receptacle ground shields, which reduces the mating force for mating the mezzanine header connector 102 with the mezzanine receptacle connector 104.

The frame end 438 includes at least one tab 450 (two are shown for each longitudinal header ground shield 430 in the illustrated embodiment) that is configured to be received in the corresponding housing frame 300. The tabs 450 include projections 452 extending from the sides of the tabs 450. The projections 452 may dig into the housing frame 300 to hold the longitudinal header ground shield 430 in the housing frame 300 by an interference fit. The tabs 450 and/or the blade 440 may include interference bumps 454. The interference bumps 454 are configure to engage the housing frame 300 to hold the longitudinal header ground shield 430 in the housing frame 300 by an interference fit.

The longitudinal header ground shields 430 include channels 460 defined between adjacent longitudinal header ground shields 430. The longitudinal header ground shields 430 have beams 462 extending into the channels 460. The channels 460 are configured to receive corresponding lateral header ground shields 400 (shown in FIG. 12). For example, the bridges 404 (shown in FIG. 12) between the lateral header ground shields 400 are received in the channels 460, and the beams 462 may engage the bridges 404 to create an electrical connection between the longitudinal header ground shields 430 and the lateral header ground shields 400. The beams 462 may be positioned to ensure a tight or interference fit with the lateral header ground shields 400 to ensure electrical connection between the longitudinal header ground shields 430 and the lateral header ground shields 400. Optionally the beams 462 may be deflectable to resiliently engage the lateral header ground shields 400. Alternatively, the beams 462 may be fixed or stationary to engage the lateral header ground shields 400.

Figure 16:
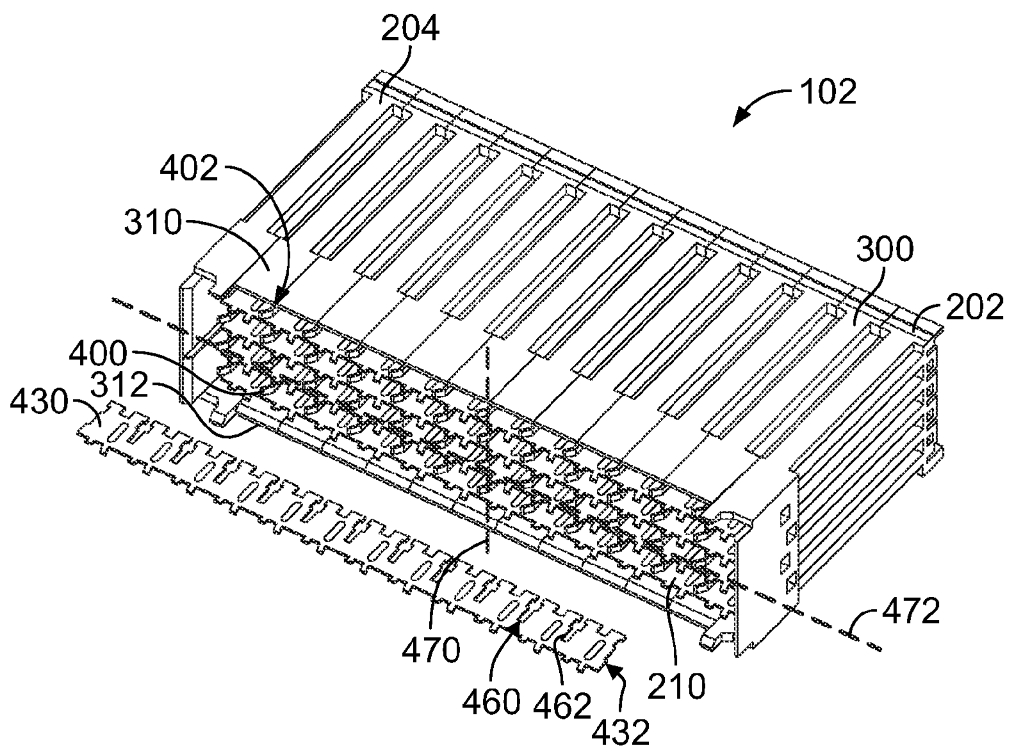
FIG. 16 is a front perspective view of the mezzanine header connector.

FIG. 16 is a front perspective view of the mezzanine header connector 102 showing one of the longitudinal header ground shield strips 432 poised for loading into the mezzanine header connector 102. FIG. 16 illustrates all of the lateral header ground shields 400 loaded into the mezzanine header connector 102 and extending laterally between the first and second edges 310, 312 of corresponding header housing frames 300 parallel to a lateral axis 470 of the mezzanine header connector 102. The lateral header ground shields 400 are generally centered between two rows of contact assemblies 210. FIG. 16 also illustrates a plurality of the longitudinal header ground shield strips 432 loaded into the mezzanine header connector 102. The longitudinal header ground shield strips 432 extend longitudinally between the end header modules 202, 204 parallel to a longitudinal axis 472 of the mezzanine header connector 102. The longitudinal header ground shields 430 are positioned between columns of contact assemblies 210.

The longitudinal header ground shield strips 432 are mechanically and electrically connected to each of the lateral header ground shield strips 402. Similarly, the lateral header ground shield strips 402 are mechanically and electrically connected to each of the longitudinal header ground shield strips 432. During assembly, when the longitudinal header ground shield strips 432 are loaded into the mezzanine header connector 102, the channels 460 receive portions of the lateral header ground shield strips 402. The longitudinal header ground strips 432 are loaded into the mezzanine header connector 102 until the longitudinal header ground shields 430 bottom out against the lateral header ground shields 400 and/or the housing frames 300.

In an exemplary embodiment, the longitudinal header ground shield strips 432 are used to absorb any mechanical tolerances of the stacked housing frames 300. For example, because the spacing between the channels 460 can be tightly controlled by stamping the longitudinal header ground shield strips 432, the reception of the lateral header ground shield strips 402 in the channels 460 properly spaces each of the lateral header ground shield strips 402 relative to the longitudinal header ground shield strips 432. As such, the housing frames 300, and thus the contact assemblies 210 held by the housing frames 300, are properly positioned. Optionally, the beams 462 may be deflectable to absorb tolerances and accommodate slight variations in the positions of the lateral header ground shield strips 402.

Figure 17:
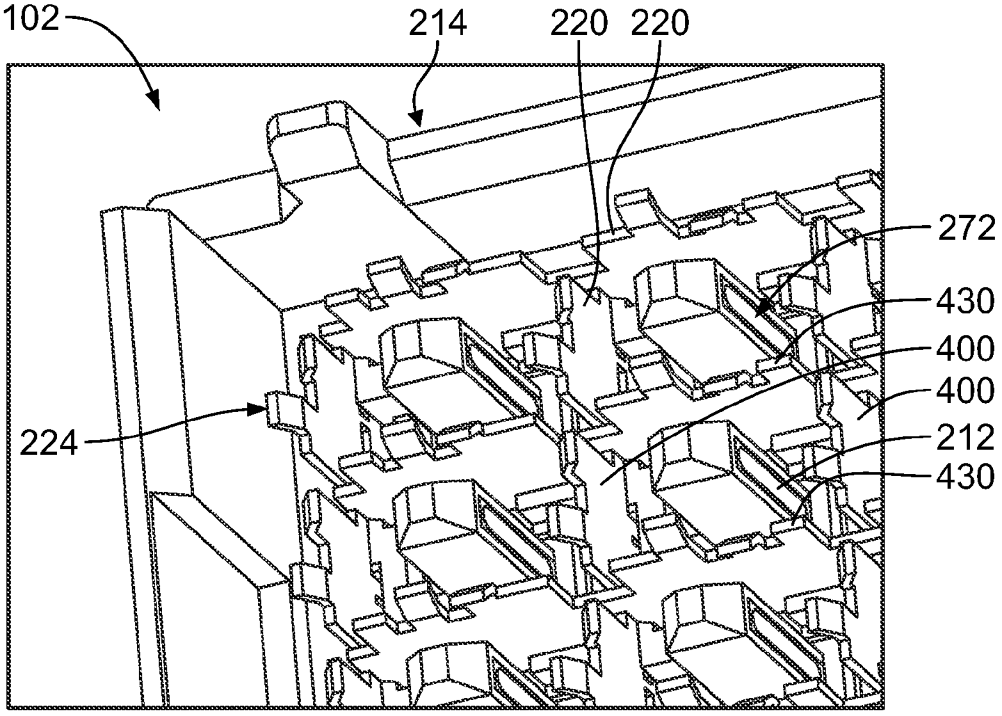
FIG. 17 illustrates a portion of the mezzanine header connector showing a front ground lattice.

FIG. 17 illustrates a portion of the mezzanine header connector 102 showing the front ground lattice 224. The lateral header ground shields 400 and longitudinal header ground shields 430 making up the front ground lattice 224 are mechanically and electrically connected to each other and to the housing frames 300 (shown in FIG. 16). In an exemplary embodiment, each pair of header contacts 212 is entirely peripherally surrounded by corresponding lateral header ground shields 400 and longitudinal header ground shields 430. Each pair of header contacts 212 is electrically shielded from each other pair of header contacts 212 by the lateral header ground shields 400 and/or the longitudinal header ground shields 430. In the illustrated embodiment, the lateral header ground shields 400 and the longitudinal header ground shields 430 form a box around each pair of header contacts 212. Each box is defined by two longitudinal header ground shields 430 on opposite sides of the box and two lateral header ground shields 400 on opposite sides of the box that are generally perpendicular to the longitudinal header ground shields 430. The front ground lattice 224 is provided at the front 214 of the mezzanine header connector 102 such that the front header ground shields 220 provide peripheral electrical shielding for the mating segments 272 of corresponding header contacts 212.

Figure 18:
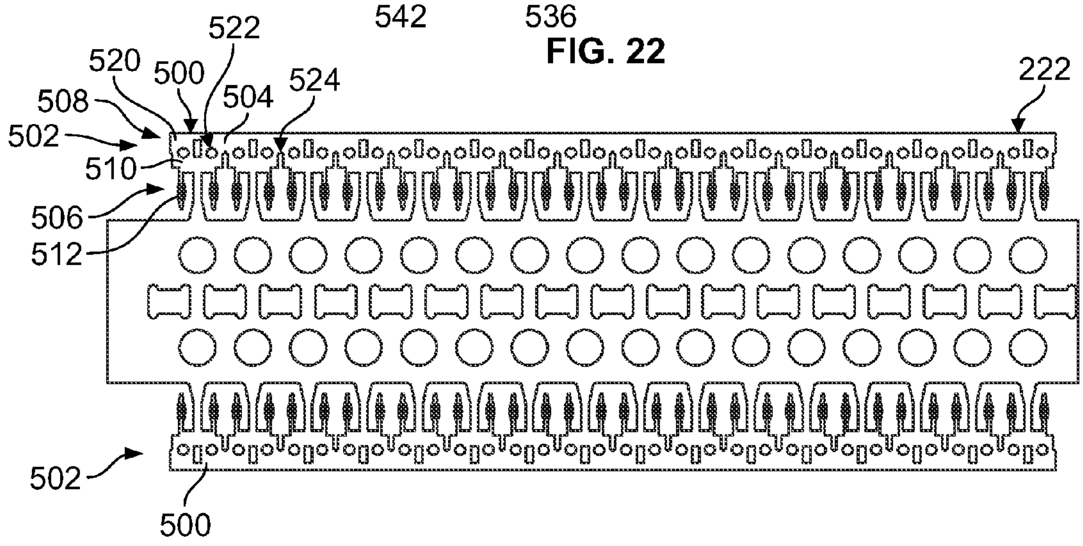
FIG. 18 illustrates a plurality of rear header ground shields formed in accordance with an exemplary embodiment.

FIG. 18 illustrates a plurality of rear header ground shields 222 formed in accordance with an exemplary embodiment. FIG. 18 illustrates the rear header ground shields 222 on a carrier which may be trimmed and later removed. In an exemplary embodiment, the rear header ground shields 222 are configured to be positioned in the mezzanine header connector 102 (shown in FIG. 2) and extend laterally across the mezzanine header connector 102. As such, the rear header ground shields 222 define lateral header ground shields, which may be referred to hereinafter as lateral header ground shields 500. Optionally, the lateral header ground shields 500 may be embedded in the housing frames 300 (shown in FIG. 2). For example, the lateral header ground shields 500 may be overmolded by the housing frames 300.

A plurality of the lateral header ground shields 500 are arranged together as part of a common lateral header ground shield strip 502. The lateral header ground shield strip 502 may include any number of the lateral header ground shields 500. The lateral header ground shield strip 502 includes bridges 504 extending between adjacent lateral header ground shields 500. The widths of the bridges 504 control the lateral spacing of the lateral header ground shields 500. The lateral header ground shields 500 each include a mating end 506 and a frame end 508 opposite the mating end 506. The mating end 506 is configured to be mechanically and electrically coupled to the circuit board 106 (shown in FIG. 1). The frame end 508 is configured to be mechanically and electrically connected to the housing frame 300.

In the illustrated embodiment, the mating end 506 includes a base 510 that is generally planar. The base 510 is configured to be, at least partially, received in the corresponding housing frame 300 (shown in FIG. 5). In an exemplary embodiment, the lateral header ground shields 500 include compliant pins 512 extending from corresponding bases 510. The compliant pins 512 may be eye-of-the-needle pins. The compliant pins 512 may be received in plated vias in the circuit board 106 to mechanically and electrically couple the lateral header ground shield strip 502 to the circuit board 106. Optionally, each base 510 may include multiple compliant pins 512.

The frame end 508 includes at least one tab 520 defining part of, or extending from, the base 510. The tab 520 is configured to be received in the corresponding housing frame 300. The tab 520 includes at least one opening 522 extending therethrough. Portions of the corresponding housing frame 300 may be received in the opening 522 to secure the lateral header ground shields 500 in the housing frames 300. For example, when the housing frames 300 are overmolded over the lateral header ground shields 500, the material of the corresponding housing frame 300 may be molded into the opening 522. Optionally, channels 524 may be provided between tabs 520. The channels 524 may be aligned with the bridges 504.

Figure 19:
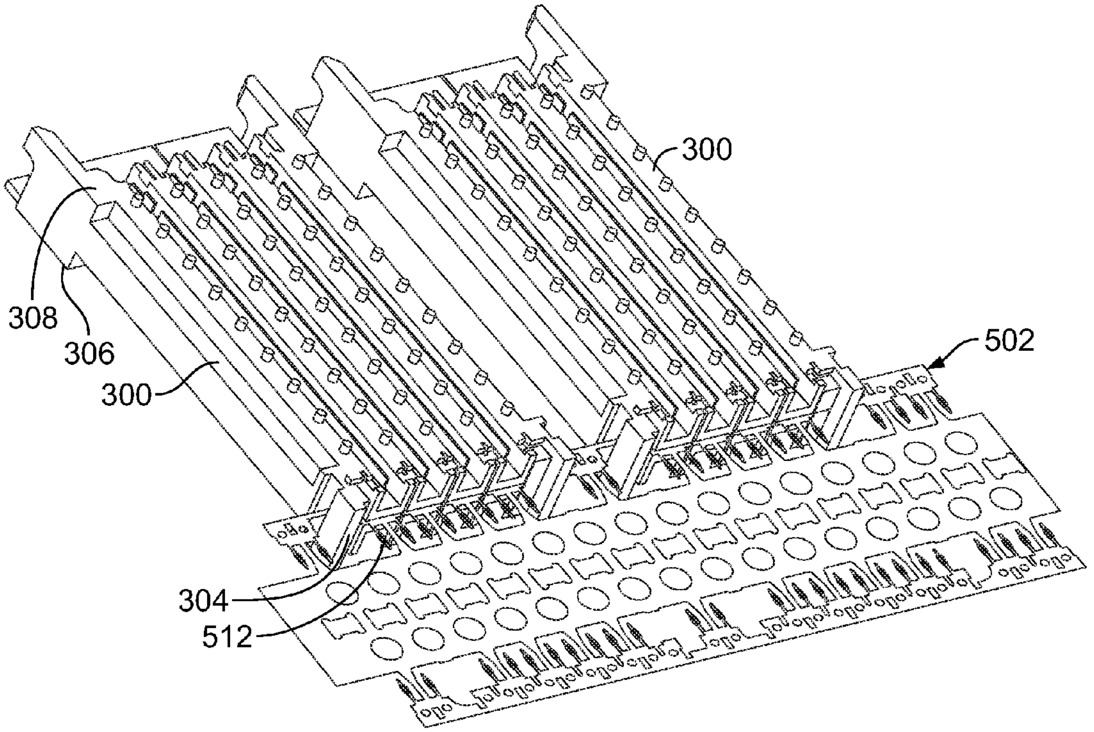
FIG. 19 illustrates housing frames overmolded over corresponding header ground shields.

FIG. 19 illustrates housing frames 300 overmolded over corresponding lateral header ground shield strips 502. In an exemplary embodiment, both sides of the carrier include lateral header ground shield strips 502, and housing frames 300 will be overmolded over the lateral header ground shield strips 502 on both sides of the carrier. The lateral header ground shield strips 502 are approximately centered between the first and second sides 306, 308 of the housing frames 300. The compliant pins 512 extend beyond the rear end 304 for termination to the circuit board 106 (shown in FIG. 1). Once overmolded, the lateral header ground shield strips 502 are secured in the housing frames 300.

Figure 20:
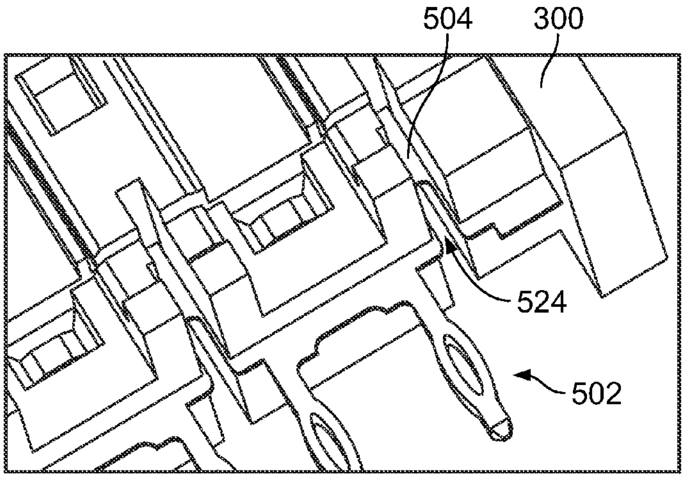
FIG. 20 illustrates a portion of one of the housing frames with the header ground shields embedded therein.

FIG. 20 illustrates a portion of one of the housing frames 300 with the corresponding lateral header ground shield strip 502 embedded therein. The lateral header ground shield strip 502 is electrically connected to the conductive body of the housing frame 300 to form an electrical connection between the housing frame 300 and the lateral header ground shield strip 502. Portions of the lateral header ground shield strip 502 are exposed for connection to a corresponding longitudinal header ground shield strip 532 (shown in FIG. 21). For example, the bridges 504 and the channels 524 may be exposed for interfacing with the longitudinal header ground shield strip 532.

Figure 21:
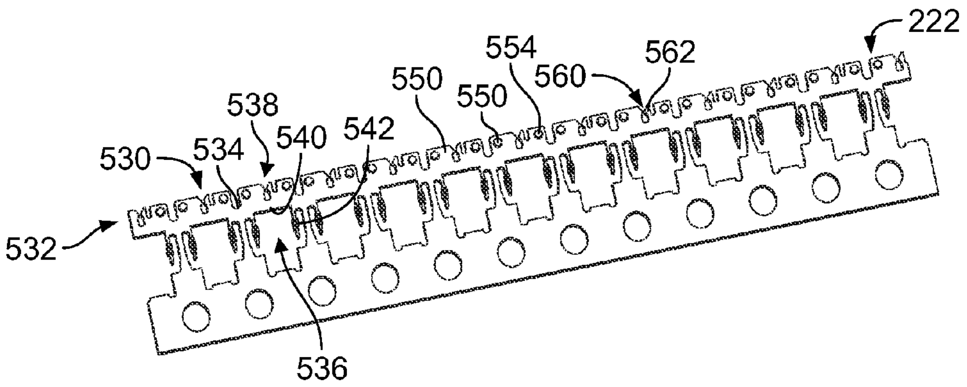
FIG. 21 illustrates a plurality of rear header ground shields formed in accordance with an exemplary embodiment.

FIG. 21 illustrates a plurality of rear header ground shields 222 formed in accordance with an exemplary embodiment.

Figure 22:
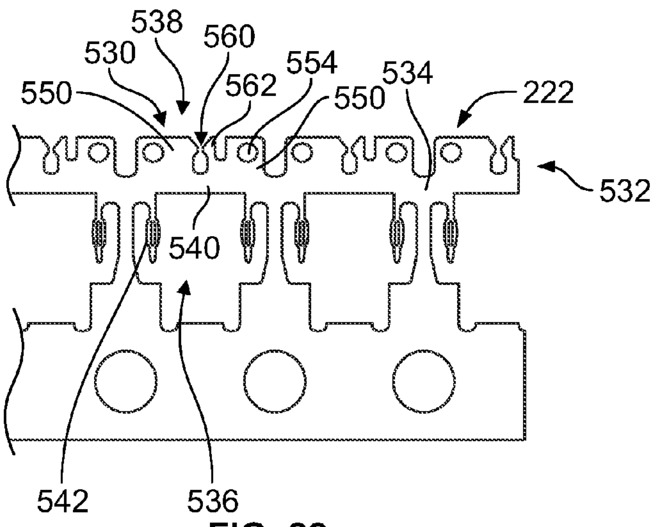
FIG. 22 is a side view of a subset of the rear header ground shields.

FIG. 21 illustrates the rear header ground shields 222 on a carrier which is configured to be later removed. FIG. 22 is a side view of a subset of the rear header ground shields 222. In an exemplary embodiment, the rear header ground shields 222 are configured to be loaded into the mezzanine header connector 102 (shown in FIG. 2) and extend longitudinally across the mezzanine header connector 102. As such, the rear header ground shields 222 define longitudinal header ground shields, which may be referred to hereinafter as longitudinal header ground shields 530.

A plurality of the longitudinal header ground shields 530 are arranged together as part of a common longitudinal header ground shield strip 532. The longitudinal header ground shield strip 532 may include any number of the longitudinal header ground shields 530. The longitudinal header ground shield strip 532 includes bridges 534 extending between adjacent longitudinal header ground shields 530. The widths of the bridges 534 control the longitudinal spacing of the longitudinal header ground shields 530. The longitudinal header ground shields 530 each include a mating end 536 and a frame end 538 opposite the mating end 536. The mating end 536 is configured to be mechanically and electrically coupled to the circuit board 106 (shown in FIG. 1). The frame end 538 is configured to be mechanically and electrically connected to the housing frame 300 (shown in FIG. 2).

In the illustrated embodiment, the mating end 536 includes a base 540 that is generally planar. In an exemplary embodiment, the longitudinal header ground shields 530 include compliant pins 542 extending from corresponding bases 540. The compliant pins 542 may be eye-of-the-needle pins. The compliant pins 542 may be received in plated vias in the circuit board 106 to mechanically and electrically couple the longitudinal header ground shield strip 532 to the circuit board 106. Optionally, each base 540 may include multiple compliant pins 542.

The frame end 538 includes at least one tab 550 (two are shown for each longitudinal header ground shield 530 in the illustrated embodiment) that is configured to be received in the corresponding housing frame 300. The tabs 550 and/or the base 540 may include interference bumps 554. The interference bumps 554 are configured to engage the housing frame 300 to hold the longitudinal header ground shield 530 in the housing frame 300 by an interference fit.

The longitudinal header ground shields 530 include channels 560 with beams 562 extending into or along the channels 560. The channels 560 are configured to receive portions of corresponding lateral header ground shields 500 (shown in FIG. 18). For example, the bridges 504 (shown in FIG. 18) between the lateral header ground shields 500 are received in the channels 560, and the beams 562 engage the bridges 504 to create an electrical connection between the longitudinal header ground shields 530 and the lateral header ground shields 500. The beams 562 may be positioned to ensure a tight or interference fit with the lateral header ground shields 500 to ensure electrical connection between the longitudinal header ground shields 530 and the lateral header ground shields 500. Optionally the beams 562 may be deflectable to resiliently engage the lateral header ground shields 500. Alternatively, the beams 562 may be fixed or stationary to engage the lateral header ground shields 500.

Figure 23:
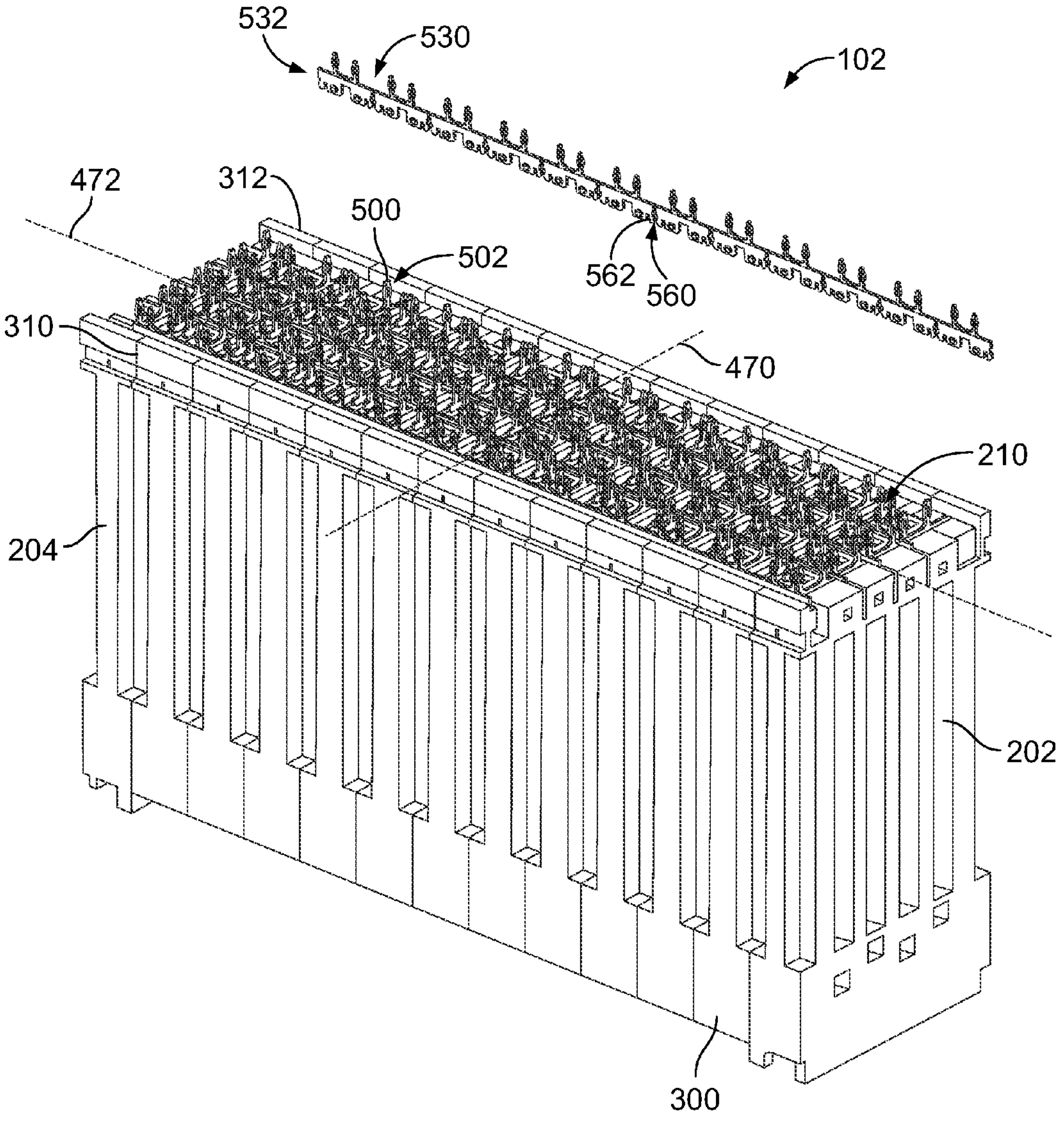
FIG. 23 is a rear perspective view of the mezzanine header connector.

FIG. 23 is a rear perspective view of the mezzanine header connector 102 showing one of the longitudinal header ground shield strips 532 poised for loading into the mezzanine header connector 102. FIG. 23 illustrates all of the lateral header ground shields 500 positioned in the mezzanine header connector 102 and extending laterally between the first and second edges 310, 312 of corresponding header frames 300 parallel to the lateral axis 470 of the mezzanine header connector 102. The lateral header ground shields 500 are generally centered between two rows of contact assemblies 210. FIG. 23 also illustrates a plurality of the longitudinal header ground shield strips 532 loaded into the mezzanine header connector 102. The longitudinal header ground shield strips 532 extend longitudinally between the end header modules 202, 204 parallel to the longitudinal axis 472 of the mezzanine header connector 102. The longitudinal header ground shields 530 are positioned between columns of contact assemblies 210.

The longitudinal header ground shield strips 532 are mechanically and electrically connected to each of the lateral header ground shield strips 502. Similarly, the lateral header ground shield strips 502 are mechanically and electrically connected to each of the longitudinal header ground shield strips 532. During assembly, when the longitudinal header ground shield strips 532 are loaded into the mezzanine header connector 102, the channels 560 receive portions of the lateral header ground shield strips 502. Similarly, the channels 524 (shown in FIG. 20) receive portions of the longitudinal header ground shield strips 532. The longitudinal header ground shield strips 532 are loaded into the mezzanine header connector 102 until the longitudinal header ground shields 530 bottom out against the lateral header ground shields 500 and/or the housing frames 300.

In an exemplary embodiment, the longitudinal header ground shield strips 532 are used to absorb any mechanical tolerances of the stacked housing frames 300. For example, because the spacing between the channels 560 can be tightly controlled by stamping the longitudinal header ground shield strips 532, the reception of the lateral header ground shield strips 502 in the channels 560 properly spaces each of the lateral header ground shield strips 502 relative to the longitudinal header ground shield strips 532. As such, the housing frames 300, and thus the contact assemblies 210 held by the housing frames 300, are properly positioned. Optionally, the beams 562 are deflectable to absorb tolerances and accommodate for slight variations in the positions of the lateral header ground shield strips 502.

Figure 24:
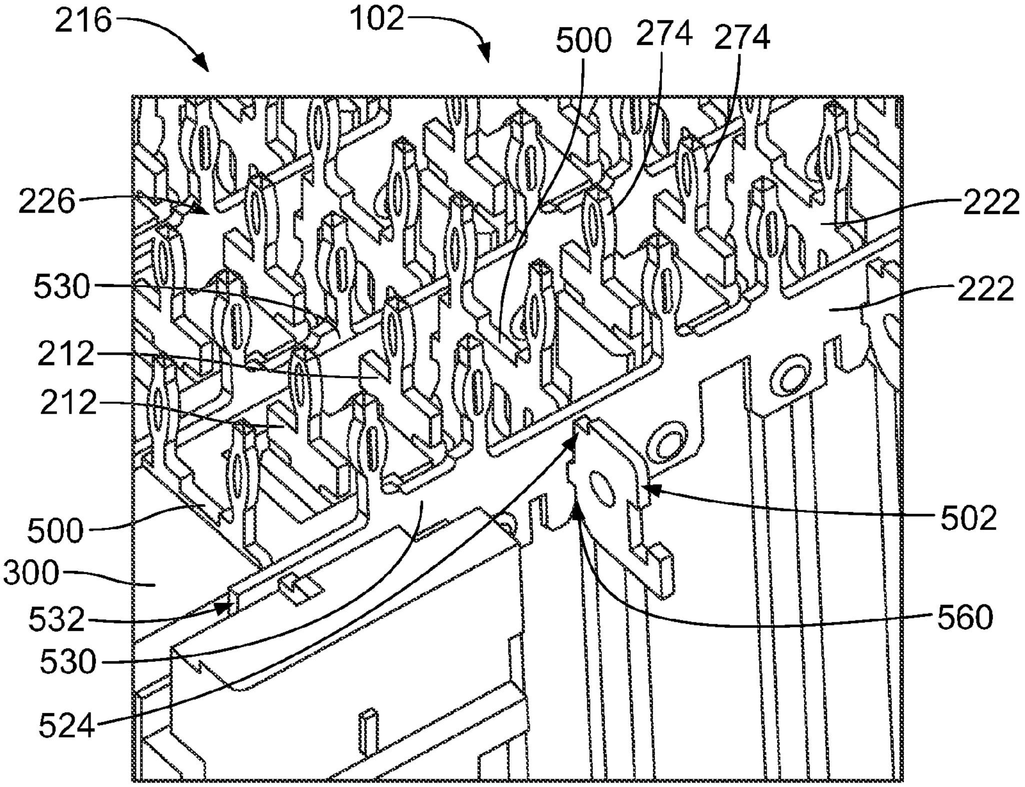
FIG. 24 illustrates a portion of the mezzanine header connector illustrating a rear ground lattice.
Figure 25:
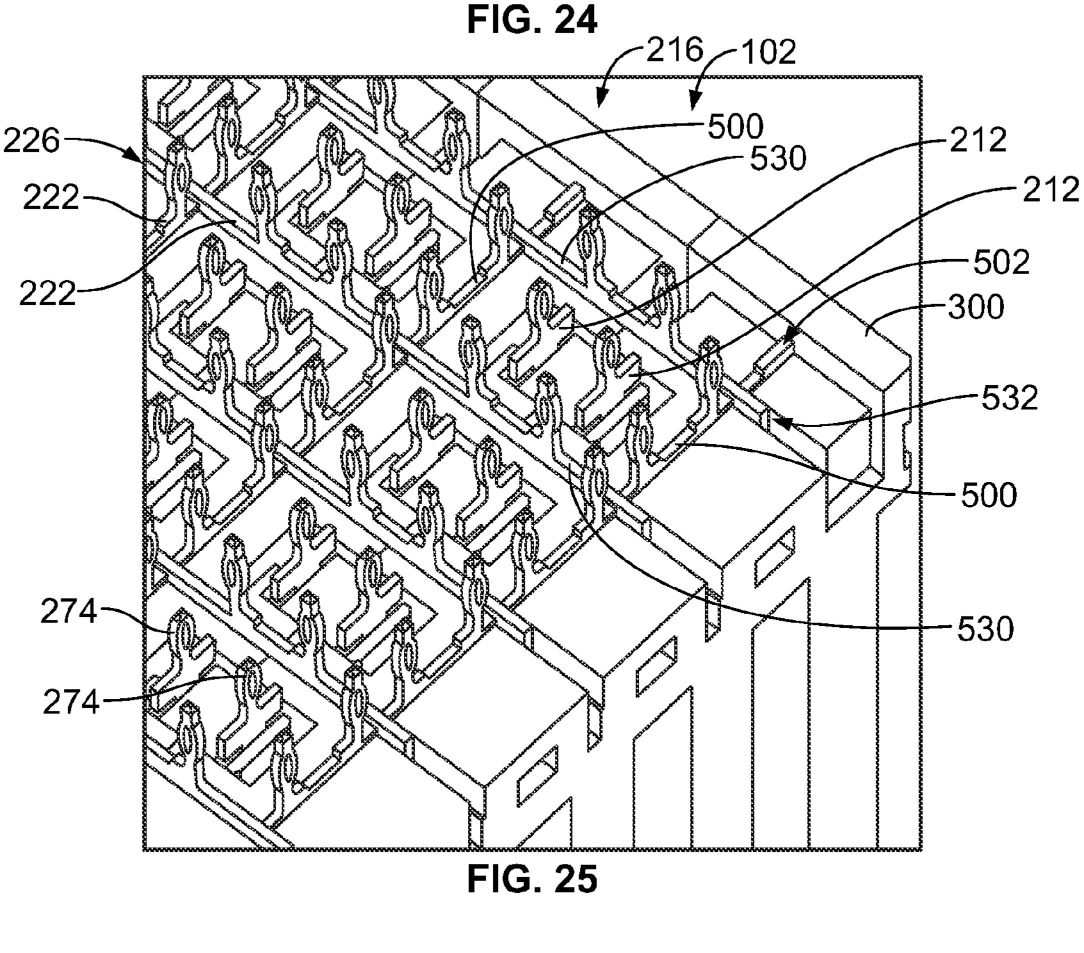
FIG. 25 illustrates a portion of the mezzanine header connector illustrating the rear ground lattice.

FIG. 24 illustrates a portion of the mezzanine header connector 102 with some of the housing frames 300 removed to illustrate the rear ground lattice 226. FIG. 25 illustrates a portion of the mezzanine header connector 102 showing the rear ground lattice 226 relative to the housing frames 300.

The lateral header ground shields 500 and longitudinal header ground shields 530 making up the rear ground lattice 226 are mechanically and electrically connected to each other and to the housing frames 300. When the longitudinal header ground shield strips 532 are loaded into the mezzanine header connector 102, the channels 560 receive portions of the lateral header ground shield strips 502. The beams 562 (shown in FIG. 22) engage the lateral header ground shield strips 532 to ensure electrical connection therebetween. The lateral header ground shield strips 502 may be pinched between the beams 562 and other portions of the longitudinal header ground shields 530. Portions of the longitudinal header ground shield strips 532 are received in the channels 524 to create an electrical connection with the lateral header ground shield strips 502.

In an exemplary embodiment, each pair of header contacts 212 is entirely peripherally surrounded by corresponding lateral header ground shields 500 and longitudinal header ground shields 530. Each pair of header contacts 212 are electrically shielded from each other pair of header contacts 212 by the lateral header ground shields 500 and/or the longitudinal header ground shields 530. In the illustrated embodiment, the lateral header ground shields 500 and the longitudinal header ground shields 530 form a box around each pair of header contacts 212. Each box may be defined by two longitudinal header ground shields 530 on opposite sides of the box and two lateral header ground shields 500 on opposite sides of the box that are generally perpendicular to the longitudinal header ground shields 530. The rear ground lattice 226 is provided at the rear 216 of the mezzanine header connector 102 such that the rear header ground shields 222 provide peripheral electrical shielding for the terminating segments 274 of corresponding header contacts 212.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A mezzanine header connector comprising:

a plurality of header modules stacked side-by-side, the plurality of header modules comprising a plurality of contact assemblies, the plurality of header modules comprising a plurality of housing frames holding corresponding contact assemblies;

each contact assembly comprising a plurality of header contacts held by at least one dielectric holder, the header contacts having mating segments exposed at a mating end of the dielectric holder for termination to corresponding receptacle contacts of a mezzanine receptacle connector, the header contacts having terminating segments extending from a mounting end of the dielectric holder for termination to a circuit board, each of the header contacts extending along a linear path between the corresponding mating segment and the corresponding terminating segment; and each housing frame having walls defining pockets receiving corresponding header contacts of the contact assembly, the housing frame being conductive and providing shielding around the associated header contacts of the contact assemblies, the header contacts facing associated walls with air separating the header contacts and the walls along a majority of the header contacts.

2. The mezzanine header connector of claim 1, wherein the housing frames are stacked adjacent each other in abutting contact with each other, the contact assemblies being surrounded by associated housing frames with the housing frames providing electrical shielding for the header contacts of at least two different contact assemblies.

3. The mezzanine header connector of claim 1, wherein the housing frames include opposite first and second edges, the first and second edges abutting against corresponding first and second edges of adjacent header frames to create continuous perimeter walls of the mezzanine header connector.

4. The mezzanine header connector of claim 1, wherein the contact assemblies include a first set of contact assemblies and a second set of contact assemblies, the first set of contact assemblies operating at a first impedance, the second set of contact assemblies operating at a second impedance.

5. The mezzanine header connector of claim 1, wherein the dielectric holders of the first set of contact assemblies are manufactured from a first material, the dielectric holders of the second set of contact assemblies are manufactured from a second material different from the first material and having a dielectric constant less than a dielectric constant of the first material, wherein shapes of the dielectric holders of the first and second sets of the contact assemblies are identical and wherein orientations of the header contacts of the first and second sets of contact assemblies are identical.

6. The mezzanine header connector of claim 1 wherein the contact assemblies include a first set of contact assemblies and a second set of contact assemblies, the first set of contact assemblies having header contacts arranged in pairs and carrying differential pair signals, the second set of contact assemblies having header contacts carrying single ended signals.

7. The mezzanine header connector of claim 1, wherein the contact assemblies include a first set of contact assemblies and a second set of contact assemblies, the first set of contact assemblies having header contacts carrying data signals, the second set of contact assemblies having header contacts carrying power.

8. The mezzanine header connector of claim 1, wherein each contact assembly includes a pair of contact modules arranged back to back, the contact modules each having a corresponding dielectric holder holding a plurality of the header contacts, the header contacts being arranged on opposite sides of the contact assembly to form differential pairs of header contacts, wherein each housing frame has a first side and a second side, each housing frame having a first chamber at the first side and a second chamber at the second side, and wherein the contact assemblies are positioned between housing frames of adjacent header modules such that a portion of each contact assembly is received in the first chamber of one housing frame and another portion of each contact assembly is received in the second chamber of the adjacent housing frame.

9. The mezzanine header connector of claim 1, wherein the header modules are arranged in a header module stack, the mezzanine header connector further comprising a ground lattice provided at an end of the header module stack, the ground lattice comprising header ground shields discrete from the housing frames of the header modules, the header ground shields being mechanically and electrically coupled to associated housing frames, the header ground shields providing electrical shielding for the header contacts.

10. The mezzanine header connector of claim 9, wherein the header ground shields comprise longitudinal header ground shields and lateral header ground shields, the lateral header ground shields being coupled to corresponding housing frames, the longitudinal header ground shields spanning across, and being coupled to, each of the lateral header ground shields.

11. The mezzanine header connector of claim 9, wherein the header ground shields comprise longitudinal header ground shields and lateral header ground shields, the lateral header ground shields being embedded in corresponding housing frames and being overmolded by the housing frames, the longitudinal header ground shields having tabs engaging each of the lateral ground shields to electrically connect the longitudinal header ground shields to each of the lateral header ground shields.

12. A mezzanine header connector comprising:

a plurality of header modules stacked side-by-side in a header module stack, the plurality of header modules comprising a plurality of contact assemblies, the plurality of header modules comprising a plurality of housing frames holding corresponding contact assemblies;

each contact assembly comprising a plurality of header contacts held by at least one dielectric holder, the header contacts having mating segments exposed at a mating end of the dielectric holder for termination to corresponding receptacle contacts of a mezzanine receptacle connector, the header contacts having terminating segments extending from the mounting end of the dielectric holder for termination to a circuit board, each of the header contacts extending along a linear path between the corresponding mating segment and the corresponding terminating segment; and each housing frame having walls defining pockets receiving corresponding header contacts of the contact assembly, the housing frame being conductive and providing shielding around the associated header contacts of the contact assemblies; and a ground lattice provided at an end of the header module stack, the ground lattice comprising header ground shields discrete from the housing frames of the header modules, the header ground shields being mechanically and electrically coupled to associated housing frames, the header ground shields providing electrical shielding for the header contacts.

13. The mezzanine header connector of claim 12, wherein the header ground shields comprise longitudinal header ground shields and lateral header ground shields, the lateral header ground shields being coupled to corresponding housing frames, the longitudinal header ground shields being coupled to each of the lateral header ground shields and spanning across each of the housing frames.

14. The mezzanine header connector of claim 12, wherein the header ground shields comprise longitudinal header ground shields and lateral header ground shields, the lateral header ground shields being embedded in corresponding housing frames and being overmolded by the housing frames, the longitudinal header ground shields having tabs engaging each of the lateral ground shields to electrically connect the longitudinal header ground shields to each of the lateral header ground shields.

15. The mezzanine header connector of claim 14, wherein the tabs have deflectable beams engaging corresponding lateral header ground frames.

16. The mezzanine header connector of claim 12, wherein the ground lattice is provided at a front of the mezzanine header connector, the header ground shields being configured to mechanically and electrically couple to receptacle ground shields of the mezzanine receptacle connector, the header ground shields providing peripheral electrical shielding for the mating segments of corresponding header contacts.

17. The mezzanine header connector of claim 12, wherein the ground lattice is provided at a rear of the mezzanine header connector, the header ground shields being configure to mechanically and electrically couple to the circuit board, the header ground shields providing peripheral electrical shielding for the terminating segments of corresponding header contacts.

18. A mezzanine header connector comprising:

a plurality of header modules stacked side-by-side, each header module comprising a contact assembly and a housing frame holding the corresponding contact assembly;

the contact assembly comprising a pair of contact modules arranged back-to-back, the contact modules each having a dielectric holder holding a plurality of header contacts, the header contacts being arranged on opposite sides of the contact assembly to form differential pairs of header contacts, the dielectric holder extending between a mating end and a mounting end opposite the mating end, the dielectric holder having an inner side and an outer side, the header contacts having mating segments exposed along the outer side at the mating end for termination to corresponding receptacle contacts of a mezzanine receptacle connector, the header contacts having terminating segments extending from the mounting end of the dielectric holder for termination to a circuit board, each of the header contacts extending along a linear path between the corresponding mating segment and the corresponding terminating segment, the inner sides of the dielectric holders of the pair of contact modules abutting against each other such that the header contacts face away from each other; and the housing frame having a first side and a second side, the housing frame having a first chamber at the first side and a second chamber at the second side;

wherein the contact assemblies are positioned between housing frames of adjacent header modules such that a portion of each contact assembly is received in the first chamber of one housing frame and another portion of each contact assembly is received in the second chamber of the adjacent housing frame, the housing frames being conductive and providing shielding around the pairs of header contacts.

19. The mezzanine header connector of claim 18, wherein the housing frames are stacked adjacent each other in abutting contact with each other, the contact assemblies being surrounded by associated housing frames with the housing frames providing electrical shielding for the header contacts of at least two different contact assemblies.

20. The mezzanine header connector of claim 18, wherein the header modules are arranged in a header module stack, the mezzanine header connector further comprising a ground lattice provided at an end of the header module stack, the ground lattice comprising header ground shields discrete from the housing frames of the header modules, the header ground shields being mechanically and electrically coupled to associated housing frames, the header ground shields providing electrical shielding for the header contacts.

* * * * *